US012189229B2

(12) United States Patent
Yonemoto et al.

(10) Patent No.: US 12,189,229 B2
(45) Date of Patent: Jan. 7, 2025

(54) LIQUID CRYSTAL DIFFRACTION ELEMENT COMPRISING AN OPTICAL AXIS DERIVED FROM A LIQUID CRYSTAL COMPOUND THAT CONTINUOUSLY ROTATES IN AT LEAST ONE IN-PLANE DIRECTION, IMAGE DISPLAY APPARATUS, AND HEAD MOUNTED DISPLAY

(71) Applicant: FUJIFILM Corporation, Tokyo (JP)

(72) Inventors: Takashi Yonemoto, Minamiashigara (JP); Masaaki Suzuki, Minamiashigara (JP); Koji Iijima, Minamiashigara (JP); Hiroshi Sato, Minamiashigara (JP); Ayato Sekine, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/679,967

(22) Filed: May 31, 2024

(65) Prior Publication Data

US 2024/0319532 A1 Sep. 26, 2024

Related U.S. Application Data

(63) Continuation of application No. PCT/JP2022/044513, filed on Dec. 2, 2022.

(30) Foreign Application Priority Data

Dec. 3, 2021 (JP) .................. 2021-197022
Jul. 29, 2022 (JP) .................. 2022-122076

(51) Int. Cl.
*G02F 1/1335* (2006.01)
*G02B 27/01* (2006.01)
*G02F 1/13363* (2006.01)

(52) U.S. Cl.
CPC .................. *G02F 1/133504* (2013.01); *G02B 27/0172* (2013.01); *G02F 1/13363* (2013.01)

(58) Field of Classification Search
None
See application file for complete search history.

(56) References Cited

U.S. PATENT DOCUMENTS

2015/0331167 A1 11/2015 Escuti et al.
2016/0011353 A1* 1/2016 Escuti ..................... G02B 5/32
359/15

(Continued)

FOREIGN PATENT DOCUMENTS

JP 2015-532468 A 11/2015
JP 2019-36101 A 3/2019

(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2022/044513, dated Jun. 13, 2024, with an English translation.

(Continued)

*Primary Examiner* — Paul C Lee
(74) *Attorney, Agent, or Firm* — Birch, Stewart, Kolasch & Birch, LLP

(57) ABSTRACT

Provided are a liquid crystal diffraction element, an image display apparatus, and a head mounted display where occurrence of a ghost in a head mounted display such as VR glasses can be suppressed. The liquid crystal diffraction element includes at least an optically-anisotropic layer that is formed of a liquid crystal composition including a liquid crystal compound, in which the optically-anisotropic layer has a liquid crystal alignment pattern in which an orientation of an optical axis derived from the liquid crystal compound (Continued)

changes while continuously rotating in at least one in-plane direction, in a case where a length over which the optical axis rotates by 180 degrees in the one direction is set as a single period, the single period gradually changes in the one direction, and in a case where an average period of 50 periods in the one direction from a period having a longest length of the single period is represented by $\Lambda a$ and a main surface of the optically-anisotropic layer in a region having a period shorter than or equal to the average period $\Lambda a$ is observed with an optical microscope, both of a ratio between a maximum value and a minimum value among widths of 30 continuous bright lines and a ratio between a maximum value and a minimum value among widths of 30 continuous dark lines in the region are 1.2 or less.

20 Claims, 7 Drawing Sheets

(56) References Cited

U.S. PATENT DOCUMENTS

| | | | |
|---|---|---|---|
| 2019/0317450 A1 | 10/2019 | Yaroshchuk et al. | |
| 2020/0049992 A1* | 2/2020 | Peng | G06F 3/012 |
| 2021/0026049 A1 | 1/2021 | Saitoh et al. | |
| 2021/0033765 A1 | 2/2021 | Sato et al. | |
| 2021/0033770 A1* | 2/2021 | Lu | G03H 1/04 |
| 2021/0149248 A1 | 5/2021 | Saitoh et al. | |
| 2021/0208316 A1 | 7/2021 | Sato et al. | |
| 2023/0161211 A1 | 5/2023 | Kodama et al. | |

FOREIGN PATENT DOCUMENTS

| | | |
|---|---|---|
| WO | WO2019/182052 A1 | 9/2019 |
| WO | WO2019/189586 A1 | 10/2019 |
| WO | WO2019/203357 A1 | 10/2019 |
| WO | WO2020/022434 A1 | 1/2020 |
| WO | WO2020/066429 A1 | 4/2020 |

OTHER PUBLICATIONS

International Search Report (Form PCT/ISA/210) for International Application No. PCT/JP2022/044513, dated Feb. 14, 2023, with English translation.

Peng et al., "Liquid Crystals for Virtual Reality (VR)," Facebook Reality Labs Research, SID2021 33-1, pp. 427-430.

* cited by examiner

LIQUID CRYSTAL DIFFRACTION ELEMENT COMPRISING AN OPTICAL AXIS DERIVED FROM A LIQUID CRYSTAL COMPOUND THAT CONTINUOUSLY ROTATES IN AT LEAST ONE IN-PLANE DIRECTION, IMAGE DISPLAY APPARATUS, AND HEAD MOUNTED DISPLAY

CROSS-REFERENCE TO RELATED APPLICATIONS

This application is a Continuation of PCT International Application No. PCT/JP2022/044513 filed on Dec. 2, 2022, which claims priority under 35 U.S.C. § 119(a) to Japanese Patent Application No. 2021-197022 filed on Dec. 3, 2021 and Japanese Patent Application No. 2022-122076 filed on Jul. 29, 2022. The above applications are hereby expressly incorporated by reference, in their entirety, into the present application.

BACKGROUND OF THE INVENTION

1. Field of the Invention

The present invention relates to a liquid crystal diffraction element that diffracts incident light, and an image display apparatus and a head mounted display that include the liquid crystal diffraction element.

2. Description of the Related Art

An optical element that controls a direction of light is used in various optical devices or systems.

For example, the optical element that controls a direction of light is used in various optical devices, for example, a backlight of a liquid crystal display device, a head mounted display (HMD) such as augmented Reality (AR) glasses, virtual reality (VR) glasses, or mixed reality (MR) glasses that display a virtual image, various information, or the like to be superimposed on a scene that is actually being seen, a head up display (HUD), a projector, a beam steering device, or a sensor for, for example, detecting a thing and measuring the distance to a thing.

As the optical element that controls a direction light, a liquid crystal diffraction element including an optically-anisotropic layer that is formed of a liquid crystal composition including a liquid crystal compound is disclosed.

JP2015-532468A describes an optical element including a birefringent material layer having local optical axis directions that vary in at least one direction along a surface thereof, in which the local optical axis directions correspond to optical axis direction profiles formed by: varying polarization of light from a light source among a plurality of polarized light components; focusing the light from the light source into a spot at a focal plane; and scanning the spot in at least two dimensions along a surface of a polarization-sensitive recording medium arranged proximate to the focal plane such that neighboring scans spatially overlap, and varying the polarization and scanning the spot are performed independently.

This liquid crystal diffraction element that changes a liquid crystal alignment pattern in a plane to diffract light is expected to be applied as an optical member for various optical devices.

For example, Liquid Crystal for virtual display (Facebook Reality Labs Research, SID2021 33-1) describes that a liquid crystal diffraction element that changes a liquid crystal alignment pattern in a plane to diffract light is used for VR glasses. In the VR glasses, a configuration where a reduction in thickness of the device is realized by using two half mirrors and reflecting light between the half mirrors to secure an optical path length is disclosed. In this configuration, in an end part of a display, light obliquely emitted from the display is incident into eyes of an observer as appropriate image light. However, typically, since the display has a high front brightness, light vertically emitted from the display transmits through the half mirrors or the like as zero-order light, and there is a concern that the transmitted light reaches the eyes of the observer as a ghost.

On the other hand, Liquid Crystal for virtual display (Facebook Reality Labs Research, SID2021 33-1) describes that, by disposing a liquid crystal diffraction element on an emission surface side of the display such that light vertically emitted from the display is diffracted in an oblique direction to be incident into the half mirrors, front light of the display is incident into the eyes of the observer as appropriate image light, and the ghost component as zero-order light is suppressed.

SUMMARY OF THE INVENTION

Further, according to an investigation by the present inventors, it was found that, even in a case where zero-order light is suppressed using the liquid crystal diffraction element in the above-described VR glasses, diffracted light other than first-order diffracted light is generated, light components emitted from different positions of the display reach the eyes of the observer, and there is a problem in that the light components are recognized as a ghost (multiple images).

An object of the present invention is to solve the above-described problem of the related art and to provide a liquid crystal diffraction element, an image display apparatus, and a head mounted display where occurrence of a ghost in a head mounted display such as VR glasses can be suppressed.

In order to achieve the object, the present invention has the following configurations.

[1] A liquid crystal diffraction element comprising:
at least an optically-anisotropic layer that is formed of a liquid crystal composition including a liquid crystal compound,
in which the optically-anisotropic layer has a liquid crystal alignment pattern in which an orientation of an optical axis derived from the liquid crystal compound changes while continuously rotating in at least one in-plane direction,
in a case where a length over which the optical axis rotates by 180 degrees in the one direction is set as a single period, the single period gradually changes in the one direction, and
in a case where an average period of 50 periods in the one direction from a period having a longest length of the single period is represented by $\Lambda a$ and a main surface of the optically-anisotropic layer in a region having a period shorter than or equal to the average period $\Lambda a$ is observed with an optical microscope, both of a ratio between a maximum value and a minimum value among widths of 30 continuous bright lines and a ratio between a maximum value and a minimum value among widths of 30 continuous dark lines in the region are 1.2 or less.

[2] The liquid crystal diffraction element according to [1], in which in a cross-sectional image of the optically-anisotropic layer obtained by observing a cross-section taken in a thickness direction along the one direction with a scanning electron microscope, the optically-anisotropic layer has bright portions and dark portions extending from one main surface to another main surface, and the dark portion has one or more inflection points.

[3] The liquid crystal diffraction element according to [1] or [2], in which a thickness of the optically-anisotropic layer is 3 μm or less.

[4] The liquid crystal diffraction element according to any one of [1] to [3], in which a minimum value of the single period of the optically-anisotropic layer is 1.5 μm or less.

[5] The liquid crystal diffraction element according to any one of [1] to [4], in which in the liquid crystal alignment pattern of the optically-anisotropic layer, the one direction in which the orientation of the optical axis derived from the liquid crystal compound changes while continuously rotating is provided in a radial shape from an inner side toward an outer side.

[6] The liquid crystal diffraction element according to any one of [1] to [5], in which the bright lines and the dark lines observed during the observation of the main surface of the optically-anisotropic layer with the optical microscope have an elliptical shape.

[7] An image display apparatus comprising:

the liquid crystal diffraction element according to any one of [1] to [6]; and a display panel.

[8] A head mounted display comprising:

the image display apparatus according to [7].

According to the present invention, the above-described problem of the related art can be solved, and it is possible to provide a liquid crystal diffraction element where the occurrence of diffracted light other than first-order diffracted light can be suppressed in a liquid crystal diffraction element, and an image display apparatus and a head mounted display including the liquid crystal diffraction element where occurrence of a ghost can be suppressed.

DESCRIPTION OF THE PREFERRED EMBODIMENTS

Hereinafter, a liquid crystal diffraction element, an image display apparatus, and a head mounted display according to the present invention will be described in detail with reference to preferred embodiments shown in the accompanying drawings.

In the present specification, numerical ranges represented by "to" include numerical values before and after "to" as lower limit values and upper limit values.

In the present specification, "(meth)acrylate" represents "either or both of acrylate and methacrylate".

In the present specification, visible light refers to light having a wavelength which can be observed by human eyes among electromagnetic waves and refers to light in a wavelength range of 380 to 780 nm. Invisible light refers to light in a wavelength range of shorter than 380 nm or longer than 780 nm.

In the present specification, $Re(\lambda)$ represents an in-plane retardation at a wavelength $\lambda$. Unless specified otherwise, the wavelength $\lambda$ refers to 550 nm.

In the present specification, $Re(\lambda)$ is a value measured at the wavelength $\lambda$ using AxoScan (manufactured by Axometrics, Inc.). By inputting an average refractive index $((nx+ny+nz)/3)$ and a film thickness (d (μm)) to AxoScan, the following expression is calculated.

$Re(\lambda)=R0(\lambda)$   Slow Axis Direction (°)

$R0(\lambda)$ is expressed as a numerical value calculated by AxoScan and represents $Re(\lambda)$.

[Liquid Crystal Diffraction Element]

A liquid crystal diffraction element according to an embodiment of the present invention comprises:

at least an optically-anisotropic layer that is formed of a liquid crystal composition including a liquid crystal compound, in which the optically-anisotropic layer has a liquid crystal alignment pattern in which an orientation of an optical axis derived from the liquid crystal compound changes while continuously rotating in at least one in-plane direction, in a case where a length over which the optical axis rotates by 180 degrees in the one direction is set as a single period, the single period gradually changes in the one direction, and in a case where an average period of 50 periods in the one direction from a period having a longest length of the single period is represented by $\Lambda a$ and a main surface of the optically-anisotropic layer in a region having a period shorter than or equal to the average period $\Lambda a$ is observed with an optical microscope, both of a ratio between a maximum value and a minimum value among widths of 30 continuous bright lines and a ratio between a maximum value and a minimum value among widths of 30 continuous dark lines in the region are 1.2 or less.

Figure 1:
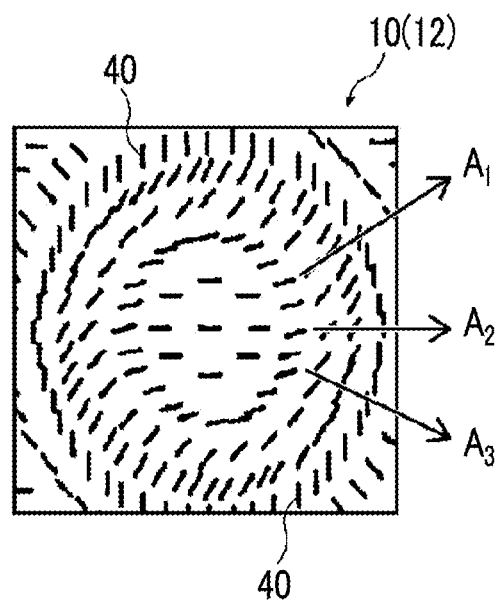
FIG. 1 is a plan view conceptually showing an optically-anisotropic layer in a liquid crystal diffraction element according to the present invention.
Figure 2:
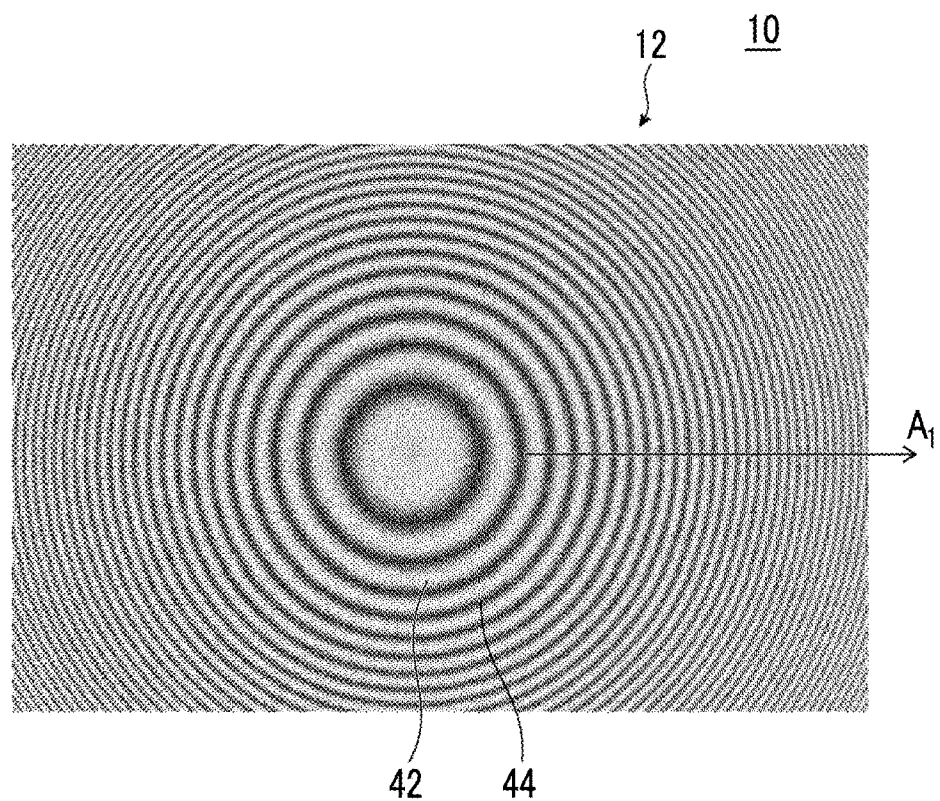
FIG. 2 is a plan view conceptually showing an example of an image obtained by observing the optically-anisotropic layer in the liquid crystal diffraction element according to the present invention with an optical microscope.
Figure 3:
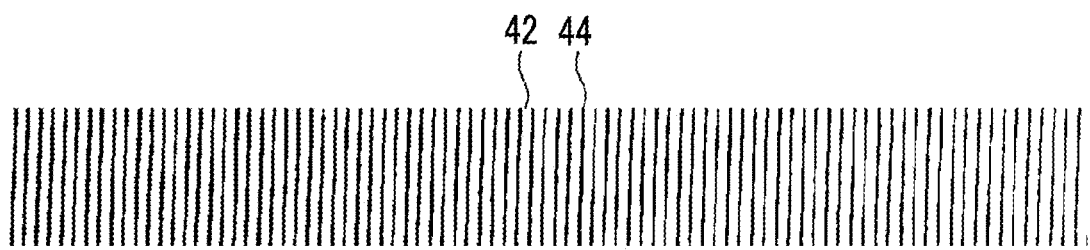
FIG. 3 is a partially enlarged view showing an image obtained by observing another location of the sample observed in FIG. 2 with the optical microscope.

FIG. 1 is a plan view conceptually showing an optically-anisotropic layer in a liquid crystal diffraction element according to an embodiment of the present invention. FIG. 2 conceptually shows an example of an image obtained by observing the optically-anisotropic layer in the liquid crystal diffraction element according to the embodiment of the present invention with an optical microscope. FIG. 3 is a partially enlarged view of FIG. 2.

A liquid crystal diffraction element 10 shown in FIGS. 1 to 3 includes an optically-anisotropic layer 12 that is formed of a composition including a liquid crystal compound.

The optically-anisotropic layer 12 is formed of a composition including a liquid crystal compound and has a predetermined liquid crystal alignment pattern in which an optical axis derived from the liquid crystal compound changes while continuously rotating in at least one in-plane direction.

In the example shown in FIG. 1, the liquid crystal alignment pattern of the optically-anisotropic layer 12 is a radial pattern where one direction (each of arrows $A_1$ to $A_3$) in which an orientation of an optical axis derived from a liquid crystal compound 40 changes while continuously rotating is provided in a radial shape directed from the inner side toward the outer side. This pattern is a pattern in which a line that connects liquid crystal compounds of which optical axes face the same direction has a circular shape and circular line segments have a concentric shape.

In the optically-anisotropic layer 12 shown in FIG. 1, the optical axis (not shown) of the liquid crystal compound 40 is a longitudinal direction of the liquid crystal compound 40.

In the optically-anisotropic layer 12 shown in FIG. 1, the orientation of the optical axis of the liquid crystal compound 40 changes while continuously rotating in a plurality of directions from the center toward the outer side of the optically-anisotropic layer 12, for example, a direction indicated by an arrow $A_1$, a direction indicated by an arrow $A_2$, a direction indicated by an arrow $A_3$, or . . . . The arrow $A_1$, the arrow $A_2$, and the arrow $A_3$ are arrangement axes described below.

Although described below in detail, the optically-anisotropic layer 12 has a predetermined liquid crystal alignment pattern in which an optical axis derived from the liquid crystal compound changes while continuously rotating in at least one in-plane direction. As a result, in a case where incident light transmits through the optically-anisotropic layer 12, an action of diffracting (bending) the transmitted light such that an azimuth direction faces a direction along the one direction is obtained. The action of diffraction by the optically-anisotropic layer 12 depends a length (single period $\Lambda$) over which the orientation of the optical axis derived from the liquid crystal compound rotates by 180° in a plane in the liquid crystal alignment pattern, and as the single period $\Lambda$ decreases, the diffraction angle increases.

In the example shown in FIG. 1, the optically-anisotropic layer 12 has the radial liquid crystal alignment pattern. Therefore, in a case where incident light is diffracted along each of the arrangement axes (for example, $A_1$ to $A_3$) such that an azimuth direction faces the center side, transmitted light can be collected. Alternatively, in a case where incident light is diffracted along each of the arrangement axes (for example, $A_1$ to $A_3$) such that an azimuth direction faces the outer side, transmitted light can be diffused. Whether or not transmitted light is diffracted toward the center side or toward the outer side depends on the polarization state of the incident light and the rotation direction of the optical axis in the liquid crystal alignment pattern. This point will be described below.

In addition, the single period of the liquid crystal alignment pattern of the optically-anisotropic layer 12 gradually changes in the one direction. In the example shown in FIG. 1, the single period changes to gradually decrease from the center toward the outer side.

As described above, the optically-anisotropic layer 12 that is formed of the composition including the liquid crystal compound and has the liquid crystal alignment pattern in which the direction of the optical axis 40A rotates in the arrangement axis D direction diffracts light, in which as the single periods $\Lambda$ of the liquid crystal alignment pattern decreases, the diffraction angle is large.

Therefore, in a case where a pattern is formed such that the single periods $\Lambda$ of the liquid crystal alignment patterns are different from each other in different in-plane regions, light that is incident into the different in-plane regions is diffracted at different angles.

For example, as in the example shown in FIG. 1, in a case where the liquid crystal alignment pattern in the optically-anisotropic layer 12 has a radial shape, the single period of the liquid crystal alignment pattern decreases from the center side toward the outer side of the optically-anisotropic layer 12 such that light incident into the end side of the optically-anisotropic layer 12 can be diffracted more than light incident into the vicinity of the center of the optically-anisotropic layer 12, and, for example, a function as a condenser lens that collects light can be more suitably exhibited.

Here, in a case where a main surface of the optically-anisotropic layer having the liquid crystal alignment pattern shown in FIG. 1 is observed using an optical microscope, bright lines and dark lines are observed depending on the alignment direction of the optical axis of the liquid crystal compound as shown in FIG. 2. In the liquid crystal alignment pattern shown in FIG. 1, a line that connects liquid crystal compounds of which optical axes face the same direction has a circular shape. Therefore, as shown in FIG. 2, the bright lines and the dark lines are concentrically observed in the optical microscope image.

In the present invention, in a case where an average period of 50 periods in the one direction from a period having a longest length of the single period is represented by $\Lambda a$, in an image obtained by observing a main surface of the optically-anisotropic layer in a region having a period shorter than or equal to the average period $\Lambda a$ with an optical microscope, both of a ratio between a maximum value and a minimum value among widths of 30 continuous bright lines and a ratio between a maximum value and a minimum value among widths of 30 continuous dark lines in the region are 1.2 or less.

In the example shown in FIG. 2, the period having the longest length of the single period is at the center position of the concentric pattern. Therefore, for example, the average value of the single periods of 50 periods in the arrow $A_1$ direction from the center is the average period $\Lambda a$.

FIG. 3 shows an example of the image obtained by observing the region having the period shorter than or equal to the average period $\Lambda a$ on the line in the arrow $A_1$ direction with the optical microscope. As shown in FIG. 3, the bright line and the dark line are alternately observed. In this image, a ratio between a maximum value and a minimum value among widths of continuous 30 bright lines in the arrow $A_1$ direction (hereinafter, also referred to as the ratio of the widths of the bright lines) is 1.2 or less. Likewise, in this image, a ratio between a maximum value and a minimum value among widths of continuous 30 dark lines in the arrow $A_1$ direction (hereinafter, also referred to as the ratio of the widths of the dark lines) is 1.2 or less.

As described above, it is described that, by disposing a liquid crystal diffraction element on an emission surface side of the display such that light vertically emitted from the display is diffracted in an oblique direction to be incident into the half mirrors, front light of the display is incident into the eyes of the observer as appropriate image light, and the ghost component as zero-order light is suppressed.

Further, according to an investigation by the present inventors, it was found that, even in a case where zero-order light is suppressed using the liquid crystal diffraction element in the above-described head mounted display (HMD) such as virtual reality (VR) glasses, diffracted light other than first-order diffracted light is generated, light components emitted from different positions of the display reach the eyes of the observer, and there is a problem in that the light components are recognized as a ghost (multiple images).

Figure 15:
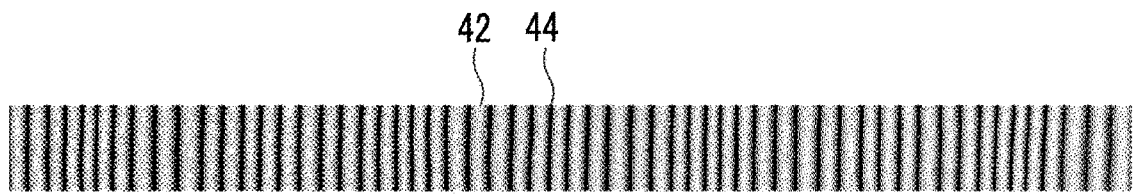
FIG. 15 is a plan view conceptually showing an example of an image obtained by observing an optically-anisotropic layer in the related art with an optical microscope.

The present inventors further investigated this point and found that, in the liquid crystal diffraction element that changes the liquid crystal alignment pattern in a plane to diffract light, in a case where a variation in the widths of the bright lines and/or the dark lines observed with the optical microscope is large as in the example shown in FIG. 15, diffracted light other than first-order diffracted light (hereinafter, also referred to as high-order diffracted light) is generated, and a ghost (multiple images) occurs. The bright lines and the dark lines correspond to the alignment direction of the optical axis of the liquid crystal compound. Therefore, it can be said that the state where the variation in the widths of the bright lines and/or the dark lines is large is a state where a variation in the single periods of the liquid crystal alignment pattern is large.

The ghost by the high-order diffracted light is more likely to occur in a case where the diffraction angle is large. As described above, the diffraction angle in the liquid crystal diffraction element depends on the single period $\Lambda$ of the liquid crystal alignment pattern, and as the single period $\Lambda$ decreases, the diffraction angle increases.

On the other hand, in the liquid crystal diffraction element according to the embodiment of the present invention, in a case where an average period of 50 periods in the one direction from a period having a longest length of the single period is represented by $\Lambda a$, in an image obtained by observing a main surface of the optically-anisotropic layer in a region having a period shorter than or equal to the average period $\Lambda a$, that is, in a region having a short single period with an optical microscope, both of a ratio between a maximum value and a minimum value among widths of 30 continuous bright lines and a ratio between a maximum value and a minimum value among widths of 30 continuous dark lines in the region are 1.2 or less. That is, in a small region including 30 bright lines or dark lines, a variation in the widths of the bright lines and the dark lines is small. In the region having a short single period, the variation in the widths of the bright lines and/or the dark lines is small, that is, the variation in the single periods of the liquid crystal alignment pattern is small such that the occurrence of the high-order diffracted light can be suppressed, and occurrence of a ghost caused by the high-order diffracted light in the HMD can be suppressed.

The configuration of the HMD including the liquid crystal diffraction element will be described below in detail.

The average period $\Lambda a$ and the widths of the bright lines and the dark lines are measured as follows.

The average period $\Lambda a$ is an average period of 50 periods in any one direction from a period having a longest length of the single period, and is obtained by measuring the total width of 100 bright lines and 100 dark lines observed in the optical microscope and dividing the value by 50.

Regarding the widths of the bright lines and the dark lines, a maximum value and a minimum value among widths of 30 continuous bright lines and a maximum value and a minimum value among widths of 30 continuous dark lines in the one direction for which the average period $\Lambda a$ is obtained in any region having a period shorter than or equal to the average period $\Lambda a$ are measured, respectively, and a ratio between the maximum value and the minimum value among the widths of the bright lines and a ratio between the maximum value and the minimum value among the widths of the dark lines are obtained. Regarding the widths of the bright lines and the dark lines, a sample on a polarization microscope is imaged under two conditions (0° arrangement/45° arrangement) by rotating the sample, and the ratios between the maximum values and the minimum values among the widths of the bright lines and the dark lines in each of the obtained images are evaluated. In addition, regarding the widths of the bright lines and the dark lines, in the obtained 8-bit (256 gradations) image, an average value of the brightest gradation and the darkest gradation is set as a threshold value, and the widths of regions brighter than the threshold value are obtained as the widths of the bright lines, and the widths of regions darker than the threshold value are obtained as the widths of the dark lines.

Figure 10:
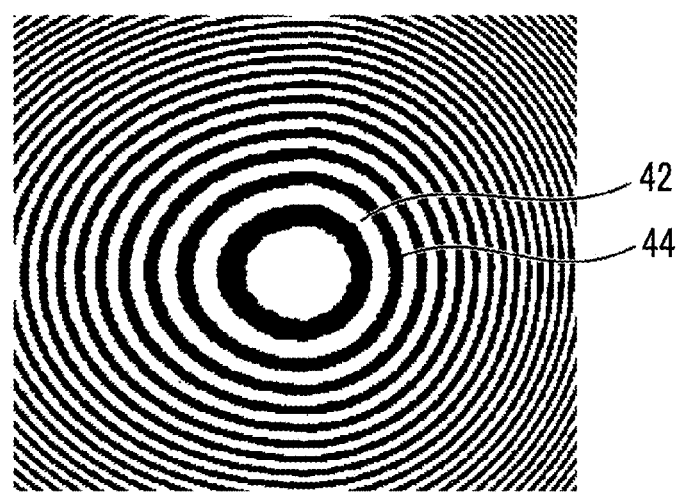
FIG. 10 is a plan view conceptually showing another example of the optically-anisotropic layer.

In addition, in a case where the liquid crystal alignment pattern of the optically-anisotropic layer has a concentric shape shown in FIG. 1 or an elliptical shape shown in FIG. 10, the measurement is performed in each of directions 0°, 45°, and 90° with respect to any one direction as the direction of 0°, and the average of the ratios may be 1.2 or less.

From the viewpoint of more suitably suppressing the ghost by the high-order diffracted light, the ratio between the maximum value and the minimum value among the widths of the 30 continuous bright lines is preferably 1.0 to 1.2, more preferably 1.0 to 1.1, and still more preferably 1.0 to 1.05. Likewise, the ratio between the maximum value and the minimum value among the widths of the 30 continuous dark lines is preferably 1.0 to 1.2, more preferably 1.0 to 1.1, and still more preferably 1.0 to 1.05.

From the viewpoint of more suitably obtaining the action of suppressing the ghost by the high-order diffracted light, in the region for which the maximum value and the minimum value among the widths of the 30 continuous bright lines and the maximum value and the minimum value among the widths of the 30 continuous dark lines are measured, a minimum value of the single period of the optically-anisotropic layer is preferably 1.5 μm or less, more preferably 0.8 μm to 1.4 μm, and still more preferably 1 μm to 1.3 μm. That is, it is preferable that, in a region where the minimum value of the single period of the optically-anisotropic layer is 1.5 μm or less, the maximum value and the minimum value among the widths of the 30 continuous bright lines and the maximum value and the minimum value among the widths of the 30 continuous dark lines are measured.

The thickness of the optically-anisotropic layer is preferably 3 μm or less, more preferably 1 μm to 2.9 μm, and still more preferably 1.5 μm to 2.8 μm.

By adjusting the thickness of the optically-anisotropic layer to be 3 μm or less, viewing angle characteristics of the liquid crystal diffraction element can be widened.

Hereinafter, the optically-anisotropic layer will be described in detail using FIGS. 4 and 5.

Figure 4:
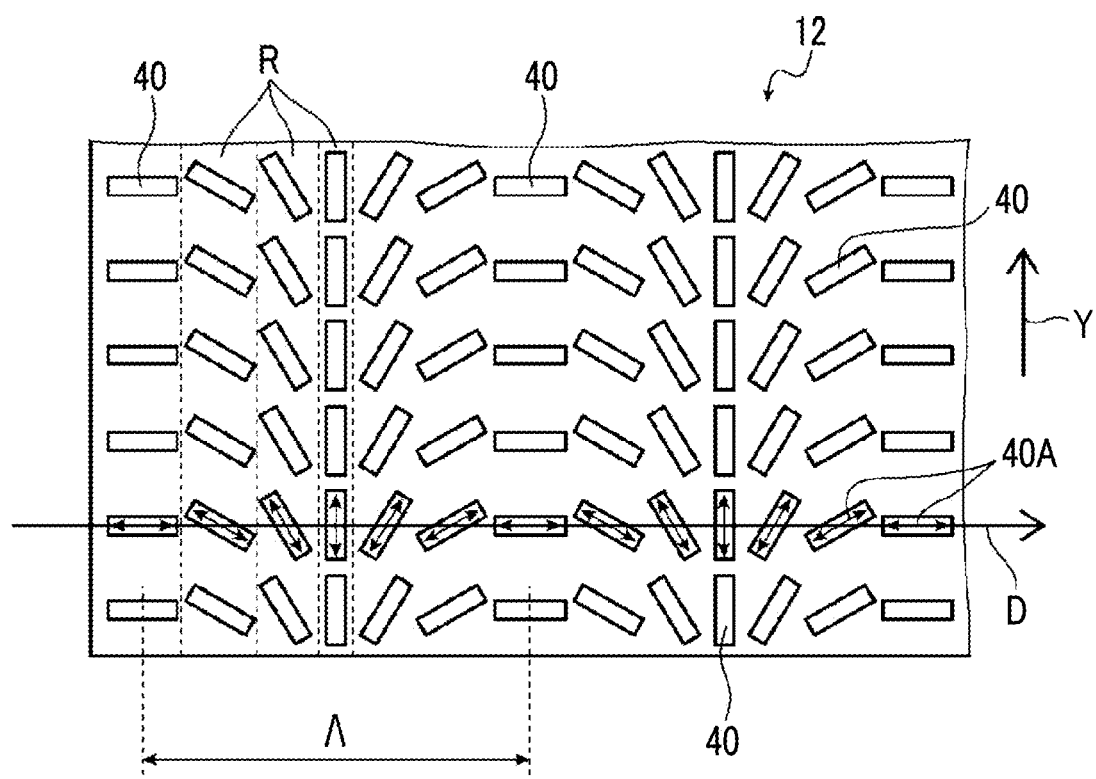
FIG. 4 is an enlarged plan view showing a part of the optically-anisotropic layer shown in FIG. 1.

FIG. 4 is an enlarged plan view showing a part of the optically-anisotropic layer shown in FIG. 1. FIG. 5 is a cross sectional view showing the optically-anisotropic layer shown in FIG. 4.

Figure 5:
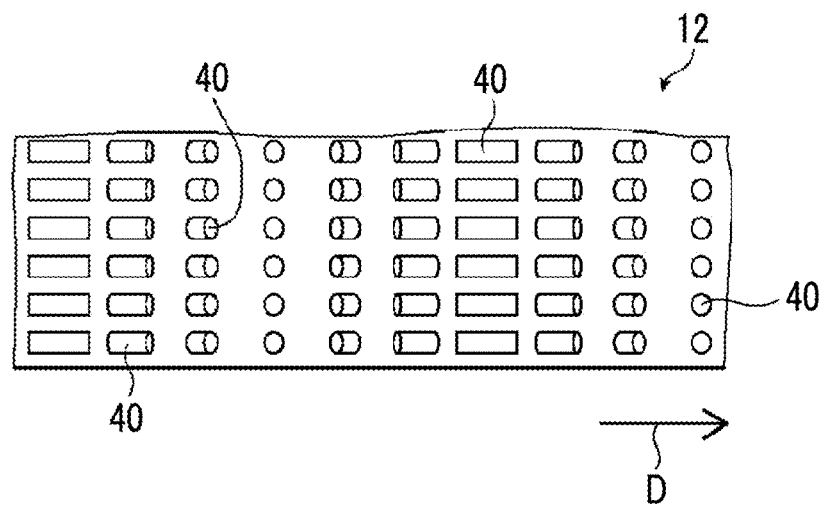
FIG. 5 is a cross sectional view showing the optically-anisotropic layer shown in FIG. 4.

In the example shown in FIG. 5, the optically-anisotropic layer 12 has a monolayer structure.

For use as the liquid crystal diffraction element, the optically-anisotropic layer 12 may be a state of being laminated on a support 30 and an alignment film 32. Alternatively, the liquid crystal diffraction element may be in a state where, for example, only the alignment film 32 and the optically-anisotropic layers 12 are laminated after peeling off the support 30. Alternatively, the liquid crystal diffraction element may be in a state where, for example, only the optically-anisotropic layer 12 is laminated after peeling off the support 30 and the alignment film 32 as shown in FIG. 5.

<Support>

The support 30 supports the alignment film 32 and the optically-anisotropic layer 12.

As the support 30, various sheet-shaped materials (films or plate-shaped materials) can be used as long as they can support the alignment film 32 and the optically-anisotropic layer 12.

A transmittance of the support 30 with respect to light to be diffracted is preferably 50% or more, more preferably 70% or more, and still more preferably 85% or more.

The thickness of the support 30 is not particularly limited and may be appropriately set depending on the use of the liquid crystal diffraction element, a material for forming the support 30, and the like in a range where the alignment film 32 and the optically-anisotropic layer 12 can be supported.

The thickness of the support 30 is preferably 1 to 1000 μm, more preferably 3 to 250 μm, and still more preferably 5 to 150 μm.

The support 30 may have a monolayer structure or a multi-layer structure.

In a case where the support 30 has a monolayer structure, examples thereof include supports formed of glass, triacetyl cellulose (TAC), polyethylene terephthalate (PET), polycarbonates, polyvinyl chloride, acryl, polyolefin, and the like. In a case where the support 30 has a multi-layer structure, examples thereof include a support including: one of the above-described supports having a monolayer structure that is provided as a substrate; and another layer that is provided on a surface of the substrate.

<Alignment Film>

The alignment film 32 is formed on the surface of the support 30.

The alignment film 32 is an alignment film for aligning the liquid crystal compound 40 to the predetermined liquid crystal alignment pattern during the formation of the optically-anisotropic layer 12.

As described above, in the present invention, the optically-anisotropic layer 12 has a liquid crystal alignment pattern in which an orientation of an optical axis 40A (refer to FIG. 4) derived from the liquid crystal compound 40 changes while continuously rotating in one in-plane direction. Accordingly, the alignment film 32 is formed such that the optically-anisotropic layer 12 can form the liquid crystal alignment pattern.

In the following description, "the orientation of the optical axis 40A rotates" will also be simply referred to as "the optical axis 40A rotates".

As the alignment film 32, various well-known photo-alignment films can be used.

In the optically-anisotropic layer, the alignment film 32 can be suitably used as a so-called photo-alignment film obtained by irradiating a photo-alignment material with polarized light or non-polarized light. That is, in the optically-anisotropic layer, a photo-alignment film that is formed by applying a photo-alignment material to the support 30 is suitably used as the alignment film 32.

The irradiation of polarized light can be performed in a direction perpendicular or oblique to the photo-alignment film, and the irradiation of non-polarized light can be performed in a direction oblique to the photo-alignment film.

Preferable examples of the photo-alignment material used in the alignment film that can be used in the present invention include: an azo compound described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B; an aromatic ester compound described in JP2002-229039A; a maleimide- and/or alkenyl-substituted nadiimide compound having a photo-alignable unit described in JP2002-265541A and JP2002-317013A; a photocrosslinking silane derivative described in JP4205195B and JP4205198B, a photocrosslinking polyimide, a photocrosslinking polyamide, or a photocrosslinking polyester described in JP2003-520878A, JP2004-529220A, and JP4162850B; and a photodimerizable compound, in particular, a cinnamate compound, a chalcone compound, or a coumarin compound described in JP1997-118717A (JP-H9-118717A), JP1998-506420A (JP-H10-506420A), JP2003-505561A, WO2010/150748A, JP2013-177561A, and JP2014-12823A.

Among these, an azo compound, a photocrosslinking polyimide, a photocrosslinking polyamide, a photocrosslinking polyester, a cinnamate compound, or a chalcone compound is suitably used.

The thickness of the alignment film 32 is not particularly limited. The thickness with which a required alignment function can be obtained may be appropriately set depending on the material for forming the alignment film 32.

The thickness of the alignment film 32 is preferably 0.01 to 5 μm and more preferably 0.05 to 2 μm.

A method (exposure method) of forming the alignment film 32 will be described in detail.

As described above, the alignment film having the alignment pattern (hereinafter, referred to as the patterned alignment film" has an alignment pattern to obtain the liquid crystal alignment pattern in which the liquid crystal compound is aligned such that the orientation of the optical axis of the liquid crystal compound in the optically-anisotropic layer formed on the patterned alignment film changes while continuously rotating in at least one in-plane direction. In a case where an axis along the orientation in which the liquid crystal compound is aligned is an alignment axis, it can be said that the patterned alignment film has an alignment pattern in which the orientation of the alignment axis changes while continuously rotating in at least one in-plane direction. The alignment axis of the patterned alignment film can be detected by measuring absorption anisotropy. For example, in a case where the amount of light transmitted through the patterned alignment film is measured by irradiating the patterned alignment film with linearly polarized light while rotating the patterned alignment film, it is observed that an orientation in which the light amount is the maximum or the minimum gradually changes in the one in-plane direction.

<Optically-Anisotropic Layer>

The optically-anisotropic layer 12 is formed on a surface of the alignment film 32.

As described above, the optically-anisotropic layer 12 is formed by immobilizing a liquid crystal phase where a liquid crystal compound is aligned and has a liquid crystal alignment pattern in which an orientation of an optical axis derived from the liquid crystal compound changes while continuously rotating in at least one in-plane direction.

In the optically-anisotropic layer 12, as conceptually shown in FIG. 5, a liquid crystal compound 40 is not helically twisted and rotated in the thickness direction, and the liquid crystal compounds 40 at the same position in a plane direction are aligned such that the orientations of optical axes 40A thereof are directed in the same orientation.

<<Method of Forming Optically-Anisotropic Layer>>

The optically-anisotropic layer can be formed by immobilizing a liquid crystal phase in a layer shape, the liquid crystal phase being aligned in a liquid crystal alignment pattern in which an orientation of an optical axis derived from the liquid crystal compound changes while continuously rotating in at least one in-plane direction.

The structure in which a liquid crystal phase is immobilized may be a structure in which the alignment of the liquid crystal compound as a liquid crystal phase is immobilized. Typically, the structure in which a liquid crystal phase is immobilized is preferably a structure which is obtained by aligning the polymerizable liquid crystal compound in the liquid crystal alignment pattern, polymerizing and curing the polymerizable liquid crystal compound with ultraviolet irradiation, heating, or the like to form a layer having no fluidity, and concurrently changing the state of the polymerizable liquid crystal compound into a state where the alignment state is not changed by an external field or an external force.

The structure in which a liquid crystal phase is immobilized is sufficient as long as the optical characteristics of the liquid crystal phase are maintained, and the liquid crystal compound 40 in the optically-anisotropic layer does not necessarily exhibit liquid crystallinity. For example, the molecular weight of the polymerizable liquid crystal compound may be increased by a curing reaction such that the liquid crystallinity thereof is lost.

Examples of a material used for forming the optically-anisotropic layer obtained by immobilizing a liquid crystal phase include a liquid crystal composition including a liquid crystal compound. It is preferable that the liquid crystal compound is a polymerizable liquid crystal compound.

In addition, the liquid crystal composition used for forming the optically-anisotropic layer may further include a surfactant and a polymerization initiator.

——Polymerizable Liquid Crystal Compound——

The polymerizable liquid crystal compound may be a rod-like liquid crystal compound or a disk-like liquid crystal compound.

Examples of the rod-like polymerizable liquid crystal compound for forming an optically-anisotropic layer include a rod-like nematic liquid crystal compound. As the rod-like nematic liquid crystal compound, an azomethine compound, an azoxy compound, a cyanobiphenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. Not only a low-molecular-weight liquid crystal compound but also a polymer liquid crystal compound can be used.

It is preferable that the alignment of the rod-like liquid crystal compound is immobilized by polymerization. Examples of the polymerizable rod-like liquid crystal compound include compounds described in Makromol. Chem., (1989), Vol. 190, p. 2255, Advanced Materials (1993), Vol. 5, p. 107, U.S. Pat. Nos. 4,683,327A, 5,622,648A, 5,770,107A, WO95/22586A, WO95/24455A, WO97/00600A, WO98/23580A, WO98/52905A, JP1989-272551A (JP-H1-272551A), JP1994-16616A (JP-H6-16616A), JP1995-110469A (JP-H7-110469A), JP1999-80081A (JP-H11-80081A), and JP2001-64627. Further, as the rod-like liquid crystal compound, for example, compounds described in JP1999-513019A (JP-H11-513019A) and JP2007-279688A can also be preferably used. In addition, two or more kinds of polymerizable liquid crystal compounds may be used in combination. In a case where two or more polymerizable liquid crystal compounds are used in combination, the alignment temperature can be decreased.

Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into the molecules of the liquid crystal compound using various methods. The number of polymerizable groups in the polymerizable liquid crystal compound is preferably 1 to 6 and more preferably 1 to 3.

In addition, as a polymerizable liquid crystal compound other than the above-described examples, for example, a cyclic organopolysiloxane compound having a cholesteric phase described in JP1982-165480A (JP-S57-165480A) can be used. Further, as the above-described polymer liquid crystal compound, for example, a polymer in which a liquid crystal mesogenic group is introduced into a main chain, a side chain, or both a main chain and a side chain, a polymer cholesteric liquid crystal in which a cholesteryl group is introduced into a side chain, a liquid crystal polymer described in JP1997-133810A (JP-H9-133810A), and a liquid crystal polymer described in JP1999-293252A (JP-H11-293252A) can be used.

——Disk-Like Liquid Crystal Compound——

As the disk-like liquid crystal compound, for example, compounds described in JP2007-108732A and JP2010-244038A can be preferably used.

In a case where the disk-like liquid crystal compound is used in the optically-anisotropic layer, the liquid crystal compound 40 rises in the thickness direction in the optically-anisotropic layer, and the optical axis 40A derived from the liquid crystal compound is defined as an axis perpendicular to a disk surface, that is so-called, a fast axis.

In addition, the addition amount of the polymerizable liquid crystal compound in the liquid crystal composition is preferably 75 to 99.9 mass %, more preferably 80 to 99 mass %, and still more preferably 85 to 90 mass % with respect to the solid content mass (mass excluding a solvent) of the liquid crystal composition.

In order to obtain a high diffraction efficiency, it is preferable that a liquid crystal compound having high refractive anisotropy $\Delta n$ is used as the liquid crystal compound.

——Surfactant——

The liquid crystal composition used for forming the optically-anisotropic layer may include a surfactant.

It is preferable that the surfactant is a compound that can function as an alignment control agent contributing to the stable or rapid alignment of the liquid crystal compound. Examples of the surfactant include a silicone-based surfactant and a fluorine-based surfactant. Among these, a fluorine-based surfactant is preferable.

Specific examples of the surfactant include compounds described in paragraphs "0082" to "0090" of JP2014-119605A, compounds described in paragraphs "0031" to "0034" of JP2012-203237A, exemplary compounds described in paragraphs "0092" and "0093" of JP2005-99248A, exemplary compounds described in paragraphs "0076" to "0078" and paragraphs "0082" to "0085" of JP2002-129162A, and fluorine (meth)acrylate polymers described in paragraphs "0018" to "0043" of JP2007-272185A.

The surfactants may be used alone or in combination of two or more kinds.

As the fluorine-based surfactant, a compound described in paragraphs "0082" to "0090" of JP2014-119605A is preferable.

The addition amount of the surfactant in the liquid crystal composition is preferably 0.01 to 10 mass %, more preferably 0.01 to 5 mass %, and still more preferably 0.02 to 2 mass % with respect to the total mass of the liquid crystal compound.

——Polymerization Initiator——

In a case where the liquid crystal composition includes a polymerizable compound, it is preferable that the liquid crystal composition includes a polymerization initiator. In an aspect where a polymerization reaction progresses with ultraviolet irradiation, it is preferable that the polymerization initiator to be used is a photopolymerization initiator which initiates a polymerization reaction with ultraviolet irradiation.

Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of a triarylimidazole dimer and p-aminophenyl ketone (described in U.S. Pat. No. 3,549,367A), an acridine compound and a phenazine compound (described in JP1985-105667A (JP-S60-105667A) and U.S. Pat. No. 4,239,850A), and an oxadiazole compound (described in U.S. Pat. No. 4,212,970A).

The content of the photopolymerization initiator in the liquid crystal composition is preferably 0.1 to 20 mass % and more preferably 0.5 to 12 mass % with respect to the content of the liquid crystal compound.

——Crosslinking Agent——

In order to improve the film hardness after curing and to improve durability, the liquid crystal composition may optionally include a crosslinking agent. As the crosslinking agent, a curing agent which can perform curing with ultraviolet light, heat, moisture, or the like can be suitably used.

The crosslinking agent is not particularly limited and can be appropriately selected depending on the purpose. Examples of the crosslinking agent include: a polyfunctional acrylate compound such as trimethylol propane tri(meth)acrylate or pentaerythritol tri(meth)acrylate; an epoxy compound such as glycidyl (meth)acrylate or ethylene glycol diglycidyl ether; an aziridine compound such as 2,2-bis hydroxymethyl butanol-tris[3-(1-aziridinyl)propionate] or 4,4-bis(ethyleneiminocarbonylamino)diphenylmethane; an isocyanate compound such as hexamethylene diisocyanate or a biuret type isocyanate; a polyoxazoline compound having an oxazoline group at a side chain thereof; and an alkoxysilane compound such as vinyl trimethoxysilane or N-(2-aminoethyl)-3-aminopropyltrimethoxysilane. In addition, depending on the reactivity of the crosslinking agent, a well-known catalyst can be used, and not only film hardness and durability but also productivity can be improved. The crosslinking agents may be used alone or in combination of two or more kinds.

The content of the crosslinking agent is preferably 3% to 20 mass % and more preferably 5% to 15 mass % with respect to the solid content mass of the liquid crystal composition. In a case where the content of the crosslinking agent is in the above-described range, an effect of improving a crosslinking density can be easily obtained, and the stability of a liquid crystal phase is further improved.

——Other Additives——

Optionally, a polymerization inhibitor, an antioxidant, an ultraviolet absorber, a light stabilizer, a coloring material, metal oxide fine particles, or the like can be added to the liquid crystal composition in a range where optical performance and the like do not deteriorate.

It is preferable that the liquid crystal composition is used as a liquid during the formation of the optically-anisotropic layer.

The liquid crystal composition may include a solvent. The solvent is not particularly limited and can be appropriately selected depending on the purpose. An organic solvent is preferable.

The organic solvent is not particularly limited and can be appropriately selected depending on the purpose. Examples of the organic solvent include a ketone, an alkyl halide, an amide, a sulfoxide, a heterocyclic compound, a hydrocarbon, an ester, and an ether. The organic solvents may be used alone or in combination of two or more kinds. Among these, a ketone is preferable in consideration of an environmental burden.

In a case where the optically-anisotropic layer 12 is formed, it is preferable that the optically-anisotropic layer 12 is formed by applying the liquid crystal composition to a surface where the optically-anisotropic layer 12 is to be formed, aligning the liquid crystal compound to a state the liquid crystal phase aligned in the predetermined liquid crystal alignment pattern, and curing the liquid crystal compound.

That is, in a case where the optically-anisotropic layer 12 is formed on the alignment film 32, it is preferable that the optically-anisotropic layer 12 obtained by immobilizing a liquid crystal phase is formed by applying the liquid crystal composition to the alignment film 32, aligning the liquid crystal compound in the predetermined liquid crystal alignment pattern, and curing the liquid crystal compound.

For the application of the liquid crystal composition, a printing method such as ink jet or scroll printing or a well-known method such as spin coating, bar coating, or spray coating capable of uniformly applying liquid to a sheet-shaped material can be used.

The applied liquid crystal composition is optionally dried and/or heated and then is cured to form the optically-anisotropic layer 12. In the drying and/or heating step, the liquid crystal compound in the liquid crystal composition only has to be aligned in the predetermined liquid crystal alignment pattern. In the case of heating, the heating temperature is preferably 200° C. or lower and more preferably 130° C. or lower.

The aligned liquid crystal compound is optionally further polymerized. Regarding the polymerization, thermal polymerization or photopolymerization using light irradiation may be performed, and photopolymerization is preferable. Regarding the light irradiation, ultraviolet light is preferably used. The irradiation energy is preferably 20 mJ/cm² to 50 J/cm² and more preferably 50 to 1500 mJ/cm². In order to promote a photopolymerization reaction, light irradiation may be performed under heating conditions or in a nitrogen atmosphere. The wavelength of irradiated ultraviolet light is preferably 250 to 430 nm.

The thickness of the optically-anisotropic layer 12 is not particularly limited, and the thickness with which a required light reflectivity can be obtained may be appropriately set depending on the use of the optically-anisotropic layer 12, the light reflectivity required for the optically-anisotropic layer 12, the material for forming the optically-anisotropic layer 12, and the like.

As described above, from the viewpoint of widening the viewing angle characteristics of the liquid crystal diffraction element, the thickness of the optically-anisotropic layer is preferably 3 μm or less.

<<Liquid Crystal Alignment Pattern of Optically-Anisotropic Layer>>

As described above, the optically-anisotropic layer 12 has the liquid crystal alignment pattern in which the orientation of the optical axis 40A derived from the liquid crystal compound 40 changes while continuously rotating in the one direction in a plane of the optically-anisotropic layer 12.

The optical axis 40A derived from the liquid crystal compound 40 is an axis having the highest refractive index in the liquid crystal compound 40, that is, a so-called slow axis. For example, in a case where the liquid crystal compound 40 is a rod-like liquid crystal compound, the optical axis 40A is parallel to a rod-like major axis direction. In the following description, the optical axis 40A derived from the liquid crystal compound 40 will also be referred to as "the optical axis 40A of the liquid crystal compound 40" or "the optical axis 40A".

FIG. 4 conceptually shows a locally enlarged plan view of the optically-anisotropic layer 12.

The plan view is a view in a case where the optically-anisotropic layer 12 is seen from the top in FIG. 5, that is, a view in a case where the optically-anisotropic layer 12 is seen from a thickness direction (laminating direction of the respective layers (films)).

In addition, in FIG. 4, in order to clarify the configuration of the optically-anisotropic layer 12, only the liquid crystal compound 40 on the surface of the alignment film 32 is shown.

As shown in FIG. 4, on the surface of the alignment film 32, the liquid crystal compound 40 forming the optically-anisotropic layer 12 has the liquid crystal alignment pattern in which the orientation of the optical axis 40A changes while continuously rotating in the predetermined one direction indicated by arrow D (hereinafter, referred to as the arrangement axis D) in a plane of the optically-anisotropic layer 12 according to the alignment pattern formed on the alignment film 32 as the lower layer. In the example shown in the drawing, the liquid crystal compound 40 has the liquid crystal alignment pattern in which the optical axis 40A of the liquid crystal compound 40 changes while continuously rotating clockwise in the arrangement axis D direction.

The liquid crystal compound 40 forming the optically-anisotropic layer 12 is two-dimensionally arranged in a direction orthogonal to the arrangement axis D and the one direction (arrangement axis D direction).

In the following description, the direction orthogonal to the arrangement axis D direction will be referred to as "Y direction" for convenience of description. That is, the arrow Y direction is a direction orthogonal to the one direction in which the orientation of the optical axis 40A of the liquid crystal compound 40 changes while continuously rotating in the optically-anisotropic layer. Accordingly, in FIG. 5 and FIGS. 6 to 8 described below, the Y direction is a direction orthogonal to the paper plane.

Specifically, "the orientation of the optical axis 40A of the liquid crystal compound 40 changes while continuously rotating in the arrangement axis D direction (the predetermined one direction)" represents that an angle between the optical axis 40A of the liquid crystal compound 40, which is arranged in the arrangement axis D direction, and the arrangement axis D direction varies depending on positions in the arrangement axis D direction, and the angle between the optical axis 40A and the arrangement axis D direction sequentially changes from θ to θ+180° or θ−180° in the arrangement axis D direction.

A difference between the angles of the optical axes 40A of the liquid crystal compounds 40 adjacent to each other in the arrangement axis D direction is preferably 45° or less, more preferably 15° or less, and still more preferably less than 15°.

In addition, in the present invention, the liquid crystal compound rotates in the orientation in which an angle between the optical axes 40A of the liquid crystal compounds 40 adjacent to each other in the arrangement axis D direction decreases. Accordingly, in the optically-anisotropic layer shown in FIGS. 4 and 5, the optical axis 40A of the liquid crystal compound 40 rotates to the right (clockwise) in the direction indicated by the arrow of the arrangement axis D.

On the other hand, in the liquid crystal compound 40 forming the optically-anisotropic layer 12, the orientations of the optical axes 40A are the same in the Y direction orthogonal to the arrangement axis D direction, that is, the Y direction orthogonal to the one direction in which the optical axis 40A continuously rotates.

In other words, in the liquid crystal compound 40 forming the optically-anisotropic layer 12, angles between the optical axes 40A of the liquid crystal compound 40 and the arrangement axis D direction are the same in the Y direction.

In the liquid crystal compounds arranged in the Y direction in the optically-anisotropic layer 12, the angles between the optical axes 40A and the arrangement axis D direction (the one direction in which the orientation of the optical axis of the liquid crystal compound 40 rotates) are the same. Regions where the liquid crystal compounds 40 in which the angles between the optical axes 40A and the arrangement axis D direction are the same are disposed in the Y direction will be referred to as "regions R".

In this case, it is preferable that an in-plane retardation (Re) value of each of the regions R is a half wavelength, that is, λ/2. The in-plane retardation is calculated from the product of a difference Δn in refractive index generated by refractive index anisotropy of the region R and the thickness of the optically-anisotropic layer. Here, the difference in refractive index generated by refractive index anisotropy of the region R in the optically-anisotropic layer is defined by a difference between a refractive index of a direction of an in-plane slow axis of the region R and a refractive index of a direction orthogonal to the direction of the slow axis. That is, the difference Δn in refractive index generated by refractive index anisotropy of the region R is the same as a difference between a refractive index of the liquid crystal compound 40 in the direction of the optical axis 40A and a refractive index of the liquid crystal compound 40 in a direction perpendicular to the optical axis 40A in a plane of the region R. That is, the difference Δn in refractive index is the same as the difference in refractive index of the liquid crystal compound 40.

In the optically-anisotropic layer 12, it is preferable that the in-plane retardation value of the plurality of regions R is a half wavelength. It is preferable that an in-plane retardation Re(550)=$\Delta n_{550} \times d$ of the plurality of regions R of the optically-anisotropic layer 12 with respect to the incidence light having a wavelength of 550 nm is in a range defined by the following Expression (1). Here, $\Delta n_{550}$ represents a difference in refractive index generated by refractive index anisotropy of the region R in a case where the wavelength of incidence light is 550 nm, and d represents the thickness of the optically-anisotropic layer 12.

$$200 \text{ nm} \le \Delta n_{550} \times d \le 350 \text{ nm} \qquad (1)$$

That is, in a case where the in-plane retardation Re(550)=$\Delta n_{550} \times d$ of the plurality of regions R of the optically-anisotropic layer 12 satisfies Expression (1), a sufficient amount of a circularly polarized light component in light incident into the optically-anisotropic layer 12 can be converted into circularly polarized light that travels in a direction tilted in a forward direction or reverse direction with respect to the arrangement axis D direction. It is more preferable that the in-plane retardation Re(550)=$\Delta n_{550} \times d$ satisfies 225 nm$\le \Delta n_{550} \times d \le$340 nm, and it is still more preferable that the in-plane retardation Re(550)=$\Delta n_{550} \times d$ satisfies 250 nm$\le \Delta n_{550} \times d \le$330 nm.

Expression (1) is a range with respect to incidence light having a wavelength of 550 nm. However, an in-plane retardation Re(λ)=$\Delta n_\lambda \times d$ of the plurality of regions R of the optically-anisotropic layer with respect to incidence light having a wavelength of λ nm is preferably in a range defined by the following Expression (1-2) and can be appropriately set.

$$0.7 \times (\lambda/2) \text{ nm} \le \Delta n_\lambda \times d \le 1.3 \times (\lambda/2) \text{ nm} \qquad (1-2)$$

In addition, the value of the in-plane retardation of the plurality of regions R of the optically-anisotropic layer 12 in a range outside the range of Expression (1) can also be used. Specifically, by satisfying $\Delta n_{550} \times d$<200 nm or 350 nm<$\Delta n_{550} \times d$, the light can be classified into light that travels in the same direction as a traveling direction of the incidence light and light that travels in a direction different from a traveling direction of the incidence light. In a case where $\Delta n_{550} \times d$ approaches 0 nm or 550 nm, the amount of the light component that travels in the same direction as a traveling direction of the incidence light increases, and the amount of the light component that travels in a direction different from a traveling direction of the incidence light decreases.

Further, it is preferable that an in-plane retardation Re(450)=$\Delta n_{450} \times d$ of each of the plurality of regions R of the optically-anisotropic layer 12 with respect to incidence light having a wavelength of 450 nm and an in-plane retardation Re(550)=$\Delta n_{550} \times d$ of each of the plurality of regions R of the optically-anisotropic layer 12 with respect to incidence light having a wavelength of 550 nm satisfy the following Expression (2). Here, $\Delta n_{450}$ represents a difference in refractive index generated by refractive index anisotropy of the region R in a case where the wavelength of incidence light is 450 nm.

$$(\Delta n_{450} \times d)/(\Delta n_{550} \times d) < 1.0 \qquad (2)$$

Expression (2) represents that the liquid crystal compound 40 in the optically-anisotropic layer 12 has reverse dispersion properties. That is, by satisfying Expression (2), the optically-anisotropic layer 12 can correspond to incidence light having a wide wavelength range.

Although the optically-anisotropic layer functions as a so-called λ/2 plate, the present invention also includes an aspect where a laminate including the support and the alignment film that are integrated functions as a so-called λ/2 plate.

In the optically-anisotropic layer 12, in the liquid crystal alignment pattern of the liquid crystal compound 40, the length (distance) over which the optical axis 40A of the liquid crystal compound 40 rotates by 180° in the arrangement axis D direction in which the optical axis 40A changes while continuously rotating in a plane is the length Λ of the single period in the liquid crystal alignment pattern.

That is, a distance between centers of two liquid crystal compounds 40 in the arrangement axis D direction is the length Λ of the single period, the two liquid crystal compounds having the same angle in the arrangement axis D direction. Specifically, as shown in FIG. 4, a distance between centers in the arrangement axis D direction of two liquid crystal compounds 40 in which the arrangement axis D direction and the direction of the optical axis 40A match each other is the length Λ of the single period. In the following description, the length Λ of the single period will also be referred to as "single period Λ".

In the liquid crystal alignment pattern of the optically-anisotropic layer 12, the single period Λ is repeated in the arrangement axis D direction, that is, in the one direction in which the orientation of the optical axis 40A changes while continuously rotating.

In a case where circularly polarized light is incident into the above-described optically-anisotropic layer 12, the light is diffracted such that the direction of the circularly polarized light is converted.

Figure 6:
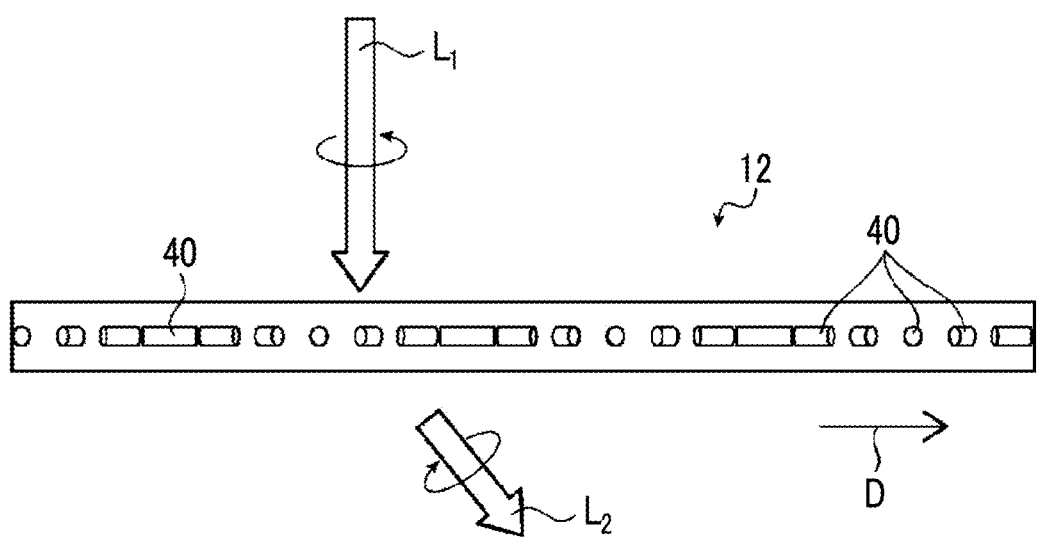
FIG. 6 is a conceptual diagram showing an action of the optically-anisotropic layer.
Figure 7:
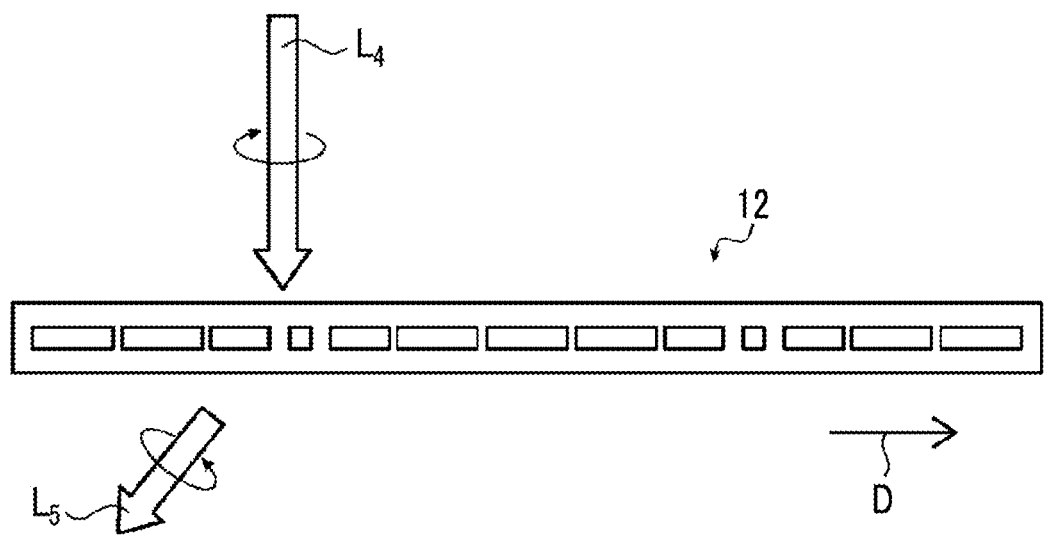
FIG. 7 is a conceptual diagram showing the action of the optically-anisotropic layer.

This action is conceptually shown in FIGS. 6 and 7. In the optically-anisotropic layer 12, the value of the product of the difference in refractive index of the liquid crystal compound and the thickness of the optically-anisotropic layer is λ/2.

As shown in FIG. 6, in a case where the value of the product of the difference in refractive index of the liquid crystal compound and the thickness of the optically-anisotropic layer 12 in the optically-anisotropic layer 12 is Λ/2 and incidence light $L_1$ as left circularly polarized light is incident into the optically-anisotropic layer 12, the incidence light $L_1$ transmits through the optically-anisotropic layer 12 to be imparted with a retardation of 180°, and the transmitted light $L_2$ is converted into right circularly polarized light.

In addition, the liquid crystal alignment pattern formed in the optically-anisotropic layer 12 is a pattern that is periodic in the arrangement axis D direction. Therefore, the transmitted light $L_2$ travels in a direction different from a traveling direction of the incidence light $L_1$. This way, the incidence light $L_1$ of the left circularly polarized light is converted into the transmitted light $L_2$ of right circularly polarized light that is tilted by a predetermined angle in the arrangement axis D direction with respect to an incidence direction. In the example shown in FIG. 6, the transmitted light $L_2$ is diffracted to travel in the lower right direction.

On the other hand, as shown in FIG. 7, in a case where the value of the product of the difference in refractive index of the liquid crystal compound of the optically-anisotropic layer 12 and the thickness of the optically-anisotropic layer 12 is $\lambda/2$ and incidence light $L_4$ as right circularly polarized light is incident into the optically-anisotropic layer 12, the incidence light $L_4$ transmits through the optically-anisotropic layer 12 to be imparted with a retardation of 180° and is converted into transmitted light $L_5$ of left circularly polarized light.

In addition, the liquid crystal alignment pattern formed in the optically-anisotropic layer 12 is a pattern that is periodic in the arrangement axis D direction. Therefore, the transmitted light $L_5$ travels in a direction different from a traveling direction of the incidence light $L_4$. In this case, the transmitted Light $L_5$ travels in a direction different from the transmitted light $L_2$, that is, in a direction opposite to the arrow direction of the arrangement axis D with respect to the incidence direction. This way, the incidence light $L_4$ is converted into the transmitted light $L_5$ of left circularly polarized light that is tilted by a predetermined angle in a direction opposite to the arrangement axis D direction with respect to an incidence direction. In the example shown in FIG. 7, the transmitted light $L_5$ is diffracted to travel in the lower left direction.

As described above, diffraction angles of the transmitted light components $L_2$ and $L_5$ can be adjusted depending on the length of the single period $\Lambda$ of the liquid crystal alignment pattern formed in the optically-anisotropic layer 12. Specifically, even in the optically-anisotropic layer 12, as the single period $\Lambda$ of the liquid crystal alignment pattern decreases, light components transmitted through the liquid crystal compounds 40 adjacent to each other more strongly interfere with each other. Therefore, the transmitted light components $L_2$ and $L_5$ can be more largely diffracted.

In addition, by reversing the rotation direction of the optical axis 40A of the liquid crystal compound 40 that rotates in the arrangement axis D direction, the diffraction direction of transmitted light can be reversed. That is, in the example FIGS. 6 and 7, the rotation direction of the optical axis 40A toward the arrangement axis D direction is clockwise. By setting this rotation direction to be counterclockwise, the diffraction direction of transmitted light can be reversed. Specifically, in FIGS. 6 and 7, in a case where the rotation direction of the optical axis 40A toward the arrangement axis D direction is counterclockwise, left circularly polarized light incident into the optically-anisotropic layer 12 from the upper side in the drawing transmits through the optically-anisotropic layer 12 such that the transmitted light is converted into right circularly polarized light and is diffracted to travel in the lower left direction in the drawing. In addition, right circularly polarized light incident into the optically-anisotropic layer 12 from the upper side in the drawing transmits through the optically-anisotropic layer 12 such that the transmitted light is converted into left circularly polarized light and is diffracted to travel in the lower right direction in the drawing.

Figure 8:
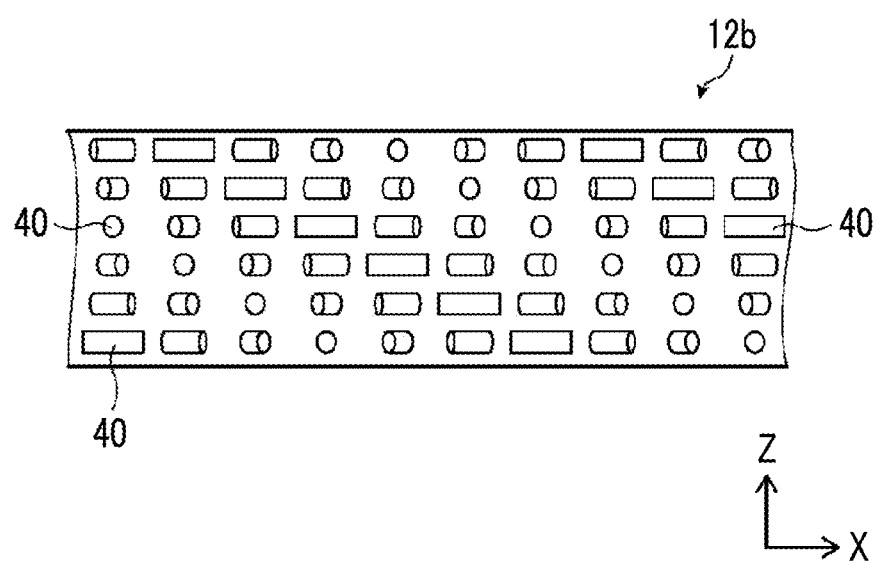
FIG. 8 is a cross sectional view conceptually showing another example of the optically-anisotropic layer.

Here, in the transmissive optically-anisotropic layer, as in an optically-anisotropic layer 12b shown in FIG. 8, it is preferable that the liquid crystal compound (the optical axis thereof) is twisted and aligned in the thickness direction. "The liquid crystal compound (optical axis) being twisted and aligned in the thickness direction" refers to a state where the orientation of the optical axis arranged in the thickness direction from one main surface to another main surface of the optically-anisotropic layer relatively changes and is twisted and aligned in the one direction. The twisting property may be right-twisted or left-twisted and may be applied depending on a desired diffraction direction. The optical axis in the entire thickness direction is twisted by less than one turn, that is, the twisted angle is less than 360°. The twisted angle of the liquid crystal compound in the thickness direction is preferably about 10° to 200° and more about preferably 20° to 180°. In the cholesteric alignment, the twisted angle is 360° or more, and selective reflectivity in which specific circularly polarized light in a specific wavelength range is reflected is exhibited. In the present specification, "twisted alignment" does not include cholesteric alignment, and selective reflectivity does not occur in the liquid crystal layer having the twisted alignment.

The optically-anisotropic layer 12b that is twisted and aligned in the thickness direction has the same configuration as the optically-anisotropic layer 12 shown in FIGS. 4 and 5, except that the liquid crystal compound is twisted and aligned in the thickness direction. That is, in a case where the optically-anisotropic layer 12b is seen from the thickness direction, as shown in FIG. 4, the optically-anisotropic layer 12b has a liquid crystal alignment pattern in which the orientation of the optical axis 40A changes while continuously rotating along the arrangement axis D in a plane.

The optically-anisotropic layer 12b that is twisted and aligned in the thickness direction has a twisted structure in which the liquid crystal compound 40 is turned and laminated in the thickness direction, and a total rotation angle between the liquid crystal compound 40 present on one main surface side of the optically-anisotropic layer 12b and the liquid crystal compound 40 present on another main surface side of the optically-anisotropic layer 12b is less than 360°.

In the optically-anisotropic layer 12b, the twisted angle in the thickness direction may be appropriately set according to the single period $\Lambda$ of the liquid crystal alignment pattern in a plane.

This way, in order for the optically-anisotropic layer to have the configuration where the liquid crystal compound is twisted and aligned in the thickness direction, the liquid crystal composition for forming the optically-anisotropic layer may contain a chiral agent.

——Chiral Agent (Optically Active Compound)——

The chiral agent has a function of causing a helical structure of a liquid crystal phase to be formed. The chiral agent may be selected depending on the purposes because a helical twisted direction and a helical twisting power (HTP) to be induced vary depending on compounds.

The chiral agent is not particularly limited, and a well-known compound (for example, Liquid Crystal Device Handbook (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes a chiral carbon atom. However, an axially chiral compound or a planar chiral compound not having a chiral carbon atom can also be used as the chiral agent. Examples of the axially chiral compound or the planar chiral compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group in the polymerizable chiral agent is the same as the polymerizable group in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

In addition, the chiral agent may be a liquid crystal compound.

In a case where the chiral agent includes a photoisomerization group, a desired twisted alignment corresponding to a luminescence wavelength can be formed by irradiation of an actinic ray or the like through a photomask after coating and alignment, which is preferable. As the photoisomerization group, an isomerization portion of a photochromic compound, an azo group, an azoxy group, or a cinnamoyl group is preferable. Specific examples of the compound include compounds described in JP2002-80478A, JP2002-80851A, JP2002-179668A, JP2002-179669A, JP2002-179670A, JP2002-179681A, JP2002-179682A, JP2002-338575A, JP2002-338668A, JP2003-313189A, and JP2003-313292A.

The content of the chiral agent in the liquid crystal composition is preferably 0.01% to 200 mol % and more preferably 1% to 30 mol % with respect to the content molar amount of the liquid crystal compound.

This way, in a case where the optically-anisotropic layer has the liquid crystal alignment pattern where the orientation of the optical axis changes while continuously rotating along the arrangement axis D in a plane and has the structure where the liquid crystal compound is twisted in the thickness direction, in an image obtained by observing a cross-section parallel to the arrangement axis with a scanning electron microscope (SEM), the optically-anisotropic layer has bright portions and dark portions extending from one main surface to another main surface and has a region where the dark portion is tilted with respect to a main surface of the optically-anisotropic layer in the thickness direction.

In an image obtained by observing a cross-section of the optically-anisotropic layer parallel to the arrangement axis with a scanning electron microscope (SEM), in a case where the optically-anisotropic layer has bright portions and dark portions extending from one main surface to another main surface, and has regions where the dark portion is tilted with respect to a main surface of the optically-anisotropic layer in the thickness direction, a decrease in the diffraction efficiency of diffracted light can be more suitably suppressed. Accordingly, in the liquid crystal diffraction element, it is preferable that the optically-anisotropic layer has regions in which the optical axis is twisted in the thickness direction and rotates.

Here, as described above, the optically-anisotropic layer that is formed using the composition including the liquid crystal compound and has the liquid crystal alignment pattern in which the direction of the optical axis rotates in the arrangement axis direction diffracts circularly polarized light, in which as the single periods A of the liquid crystal alignment pattern decreases, the diffraction angle is large.

Therefore, in a case where a pattern is formed such that the single periods A of the liquid crystal alignment patterns are different from each other in different in-plane regions, light that is incident into the different in-plane regions is diffracted at different angles.

Here, in the diffraction of light by the optically-anisotropic layer having the liquid crystal alignment pattern in which the orientation of the optical axis of the liquid crystal compound changes while continuously rotating in a plane, in a case where the diffraction angle increases, the diffraction efficiency may decrease.

Therefore, in a case where the optically-anisotropic layer has regions having different lengths of the single periods over which the orientation of the optical axis of the liquid crystal compound rotates by 180° in a plane, the diffraction angle varies depending on light incidence positions. Therefore, there may be a difference in the amount of diffracted light depending on in-plane incidence positions. That is, a region where the brightness of light transmitted and diffracted may be low depending on in-plane incidence positions is present.

On the other hand, in a case where the optically-anisotropic layer has regions in which the optical axis is twisted in the thickness direction and rotates, a decrease in the diffraction efficiency of diffracted light can be suppressed. Accordingly, in the liquid crystal diffraction element, it is preferable that the optically-anisotropic layer has regions in which the optical axis is twisted in the thickness direction of the optically-anisotropic layer and rotates, the regions where the sizes of twisted angles in the thickness direction are different.

Specifically, by setting the twisted angle in the thickness direction to be large in the region where the length of the single period Λ of the liquid crystal alignment pattern is short, the amounts of light reflected can be made to be uniform irrespective of in-plane incidence positions.

This way, in a case where the optically-anisotropic layer has regions in which lengths of the single periods over which the orientation of the optical axis of the liquid crystal compound rotates by 180° in a plane are different from each other in the in-plane direction and has regions in which the sizes of the twisted angles in the thickness direction are different in the in-plane direction, in the image of the optically-anisotropic layer obtained by observing a cross-section of the optically-anisotropic layer taken in the thickness direction along the arrangement axis D with a scanning electron microscope, the optically-anisotropic layer has bright portions and dark portions extending from one main surface to another main surface and has regions where tilt angles of the dark portions are different from each other in the plane direction.

Further, it is preferable that the optically-anisotropic layer has regions in which the average tilt angle of the dark portions with respect to the main surface of the optically anisotropic layer gradually changes along one direction (the arrangement axis D), and it is preferable that the optically-anisotropic layer has regions in which the average tilt angle of the dark portions increases as the length of the single period of the liquid crystal alignment pattern decreases.

In a case where the above-described optically-anisotropic layer has the configuration in which regions where the lengths of the single periods A over which the orientation of the optical axis of the liquid crystal compound rotates by 180° in a plane are different in the in-plane direction are provided, regions where the sizes of twisted angles in the thickness direction are different is provided, and the twisted angle in the thickness direction increases as the single period Λ of the liquid crystal alignment pattern in the region decreases, in an image obtained by observing a cross section of the optically-anisotropic layer taken in the thickness direction along the arrangement axis D with a scanning electron microscope, as the length of the single period of the liquid crystal alignment pattern decreases, the average tilt angle of the dark portions increases.

In addition, the configuration where the twisted angles in the thickness direction are different in the plane direction can be formed by adding a photoreactive chiral agent to the liquid crystal composition, applying the liquid crystal composition to the alignment film, and irradiating the regions with light at different irradiation doses such that the helical twisting power (HTP) of the photoreactive chiral agent varies depending on the regions.

Specifically, the configuration of the optically-anisotropic layer where the twisted angle of the thickness direction varies depending on in-plane regions can be formed by using the chiral agent in which back isomerization, dimerization, isomerization, dimerization or the like occurs due to light irradiation such that the helical twisting power (HTP) changes and irradiating the liquid crystal composition for forming the optically-anisotropic layer with light having a wavelength at which the HTP of the chiral agent changes before or during the curing of the liquid crystal composition while changing the irradiation dose depending on the regions.

For example, by using a chiral agent in which the HTP decreases during light irradiation, the HTP of the chiral agent decreases during light irradiation. Here, by changing the irradiation dose of light depending on the regions, for example, in a region that is irradiated with the light at a high irradiation dose, the decrease in HTP is large, the induction of helix is small, and thus the twisted angle of the twisted structure decreases. On the other hand, in a region that is irradiated with the light at a low irradiation dose, a decrease in HTP is small, and thus the twisted angle of the twisted structure is large.

The method of changing the irradiation dose of light depending on the regions is not particularly limited, and a method of irradiating light through a gradation mask, a method of changing the irradiation time depending on the regions, or a method of changing the irradiation intensity depending on the regions can be used.

The gradation mask refers to a mask in which a transmittance with respect to light for irradiation changes in a plane.

Here, it is preferable that, in a cross sectional image obtained by observing a cross section of the optically-anisotropic layer taken in the thickness direction along the one direction in which the orientation of the optical axis of the liquid crystal compound changes while continuously rotating with a scanning electron microscope, a bright portion and a dark portion extending from one main surface to another main surface are observed, and the dark portion has one or two or more inflection points of angle.

Figure 9:
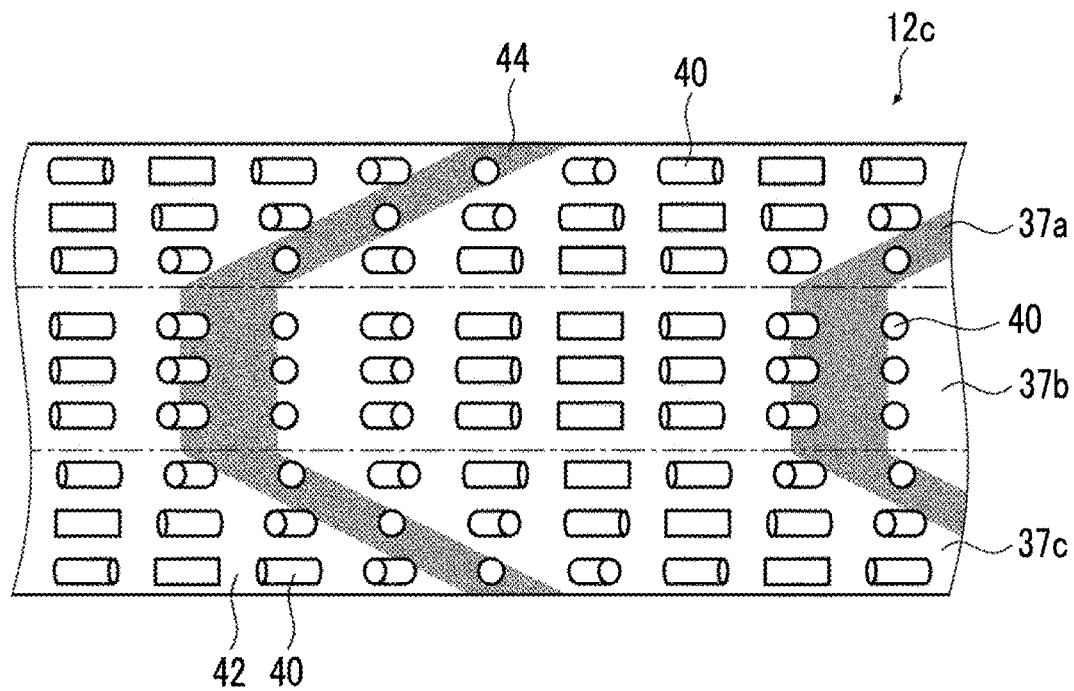
FIG. 9 is a cross sectional view conceptually showing another example of the optically-anisotropic layer.

FIG. 9 shows an example of the optically-anisotropic layer. In FIG. 9, bright portions 42 and dark portions 44 are shown to overlap a cross section of an optically-anisotropic layer 12c. In the following description, the image obtained by observing the cross section taken in the thickness direction along the one direction in which the optical axis rotates with an SEM will also be simply referred to as "cross-sectional SEM image".

In the cross-sectional SEM image of the optically-anisotropic layer 12c shown in FIG. 9, the dark portion 44 has two inflection points where the angle changes. That is, the optically-anisotropic layer 12c can also include three regions including a region 37a, a region 37b, and a region 37c corresponding to the inflection points of the dark portion 44 in the thickness direction.

The optically-anisotropic layer 12c also has, at any position in the thickness direction, the liquid crystal alignment pattern where the optical axis derived from the liquid crystal compound 40 rotates clockwise to the left direction in the drawing in the in-plane direction. In addition, the single period of the liquid crystal alignment pattern is fixed in the thickness direction.

In addition, as shown in FIG. 9, in the lower region 37c in the thickness direction, the liquid crystal compound 40 is twisted and aligned to be helically twisted clockwise (to the right) from the upper side to the lower side in the drawing in the thickness direction.

In the middle region 37b in the thickness direction, the liquid crystal compound 40 is not twisted in the thickness direction, and the optical axes of the liquid crystal compounds 40 laminated in the thickness direction face the same direction. That is, the optical axes of the liquid crystal compounds 40 present at the same position in the in-plane direction face the same direction.

In the upper region 37a in the thickness direction, the liquid crystal compound 40 is twisted and aligned to be helically twisted counterclockwise (to the left) from the upper side to the lower side in the drawing in the thickness direction.

That is, in the region 37a, the region 37b, and the region 37c of the optically-anisotropic layer 12c shown in FIG. 9, the twisted states of the liquid crystal compounds 40 in the thickness direction are different from each other.

In the optically-anisotropic layer having the liquid crystal alignment pattern in which the optical axis derived from the liquid crystal compound continuously rotates in the one direction, the bright portions and the dark portions in the cross-sectional SEM image of the optically-anisotropic layer are observed to connect the liquid crystal compounds facing the same orientation.

For example, in FIG. 9, the dark portions 44 are observed to connect the liquid crystal compounds 40 of which the optical axes face a direction orthogonal to the paper plane.

In the lowermost region 37c in the thickness direction, the dark portion 44 is tilted to the upper left side in the drawing. In the middle region 37b, the dark portion 44 extends in the thickness direction. In the uppermost region 37a, the dark portion 44 is tilted to the upper right side in the drawing.

That is, the optically-anisotropic layer 12c shown in FIG. 9 has two inflection points of angle where the angle of the dark portion 44 changes. In addition, in the uppermost region 37a, the dark portion 44 is tilted to the upper right side. In the lowermost region 37b, the dark portion 44 is tilted to the upper left side. That is, in the region 37a and the region 37c, the tilt directions of the dark portions 44 are different from each other.

Further, the optically-anisotropic layer 12c shown in FIG. 9 has one inflection point where the dark portion 44 is folded in a direction opposite to the tilt direction.

Specifically, regarding the dark portion 44 of the optically-anisotropic layer 12c, the tilt direction in the region 37a and the tilt direction in the region 37b are opposite to each other. Therefore, at the inflection point positioned at the interface between the region 37a and the region 37b, the tilt direction is folded in the opposite direction. That is, the optically-anisotropic layer 12 has one inflection point where the tilt direction is folded in the opposite direction.

In addition, in the region 37a and the region 37c of the optically-anisotropic layer 12c, for example, the thicknesses are the same, the sizes of the twisted angles of the liquid crystal compound 40 in the thickness direction are the same, and the twisted directions are different. Therefore, the shape of the dark portion 44 is symmetrical with respect to the center line in the thickness direction, and the bright portions 42 and the dark portions 44 in the cross-sectional SEM image are formed in a substantially C-shape.

In addition, in the liquid crystal diffraction element according to the embodiment of the present invention, in the cross-sectional SEM image, the liquid crystal diffraction element has the bright portions 42 and the dark portions 44 extending from one main surface to another main surface, and the dark portion 44 has one or more or two or more inflection points of angle. As a result, the wavelength dependence of the diffraction efficiency can be reduced, and light can be diffracted with the same diffraction efficiency irrespective of wavelengths.

Accordingly, by disposing a liquid crystal diffraction element on an emission surface side of a display in a head mounted display (HMD) such as virtual reality (VR) glasses, light vertically emitted from the display can be efficiently diffracted in an oblique direction, and a ghost component as zero-order light can be suppressed.

In the example shown in FIG. 9, the dark portion 44 is configured to have two inflection points of angle. However, the present invention is not limited to this configuration, and the dark portion 44 may have one inflection point of angle or may have three or more inflection points of angle. For example, in the configuration where the dark portion 44 of the optically-anisotropic layer has one inflection point of angle, for example, the optically-anisotropic layer may consist of the region 37a and the region 37c shown in FIG. 9, may consist of the region 37a and the region 37b, or may consist of the region 37b and the region 37c. Alternatively, in the configuration where the dark portion 44 of the optically-anisotropic layer has three inflection points of angle, the region 37a and the region 37c shown in FIG. 9 may be alternately provided two by two.

In all of the above-described optically-anisotropic layers, the rod-like liquid crystal compound is used as the liquid crystal compound. However, the present invention is not limited to this configuration, and a disk-like liquid crystal compound can also be used.

In the disk-like liquid crystal compound, the optical axis derived from the liquid crystal compound is defined as an axis perpendicular to a disk surface, that is so-called, a fast axis.

In addition, in the optically-anisotropic layer of the liquid crystal diffraction element according to the embodiment of the present invention, the rod-like liquid crystal compound and the disk-like liquid crystal compound may be used in combination.

In the example shown in FIG. 1 or the like, the optically-anisotropic layer has the radial liquid crystal alignment pattern where the one direction in which the orientation of the optical axis derived the liquid crystal compound changes while continuously rotating is provided in a radial shape from the inner side toward the outer side. However, the present invention is not limited to this configuration.

For example, a configuration in which the arrangement axis D of the liquid crystal alignment pattern of the optically-anisotropic layer is provided in the one direction may be adopted.

Alternatively, as in the optically-anisotropic layer 12d shown in FIG. 10, the bright lines 42 and the dark lines 44 observed during the observation of the main surface with the optical microscope may have an elliptical shape. In the example shown in FIG. 10, a plurality of the elliptical bright lines 42 and the elliptical dark lines 44 are provided, and the bright lines 42 and the dark lines 44 are arranged in an annual ring shape.

Figure 11:
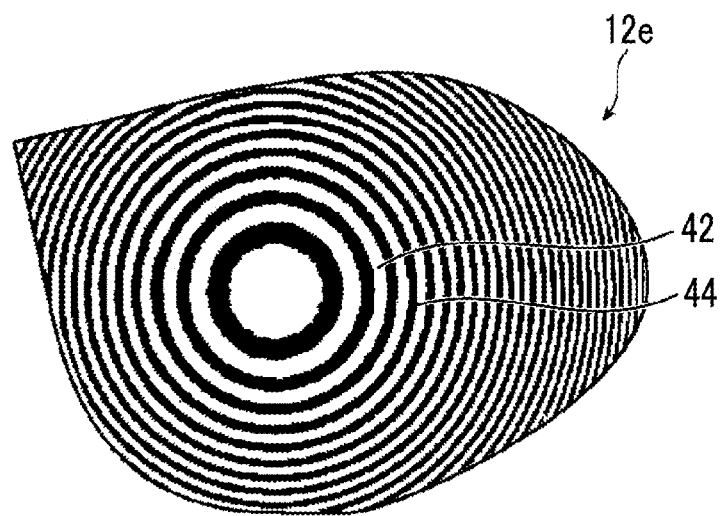
FIG. 11 is a plan view conceptually showing another example of the optically-anisotropic layer.

In addition, the planar shape of the liquid crystal diffraction element (optically-anisotropic layer) is not limited to a rectangular shape, and may be appropriately set to a circular shape, an elliptical shape, or an amorphous shape depending on the configuration of the device used in the liquid crystal diffraction element. For example, in a case where the liquid crystal diffraction element is used for a HMD, as in an optically-anisotropic layer 12e shown in FIG. 11, the planar shape of the liquid crystal diffraction element (optically-anisotropic layer) may have substantially the same shape as a lens.

<Method of Exposing Alignment Film>

Next, in the present invention, a method of exposing an alignment film will be described, this method being for obtaining the configuration in which, in a case where a main surface of the optically-anisotropic layer in a region having a period shorter than or equal to the average period Λa is observed with an optical microscope, both of a ratio between a maximum value and a minimum value among widths of 30 continuous bright lines and a ratio between a maximum value and a minimum value among widths of 30 continuous dark lines in the region are 1.2 or less.

In the suitable exposure method of the present invention, in a case where an alignment film is exposed using a direct drawing method, coordinates of exposure positions are accurately matched by alignment using an alignment marker. As a result, bright lines and dark lines where a variation in the widths is small can be formed.

Figure 12:
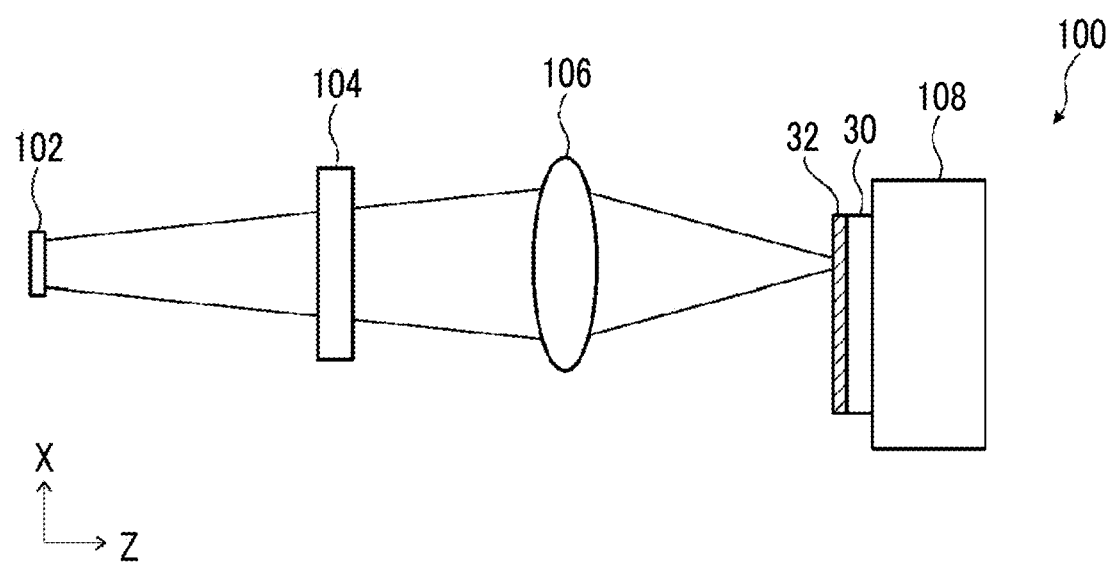
FIG. 12 is a conceptual diagram showing an example of an exposure device that exposes an alignment film for forming the optically-anisotropic layer.

FIG. 12 is a diagram conceptually showing an example of an exposure device that exposes the alignment film.

An exposure device 100 shown in FIG. 12 includes a light source 102, a λ/2 plate 104 that changes a polarization direction of light emitted from the light source 102, a lens 106 that is disposed on an optical path, and an XY stage 108. The exposure device 100 directly focuses a linearly polarized light beam onto the alignment film, and scans the focusing position to draw an alignment pattern on the alignment film.

The light source 102 includes a laser and a linearly polarizing plate, and emits linearly polarized light. The emitted linearly polarized light is incident into the λ/2 plate 104. The λ/2 plate 104 is rotatably attached, and is rotatable around an axis perpendicular to an XY plane of the XY stage 108. The λ/2 plate 104 rotates around the axis perpendicular to the XY plane to convert the polarization direction of the incident linearly polarized light into any direction. The lens 106 focuses the linearly polarized light transmitted through the λ/2 plate 104 on the surface of the alignment film 32 disposed on the XY stage 108. The support 30 including the alignment film 32 is disposed on the XY stage 108, and the alignment film 32 (support 30) is moved in the X direction and/or the Y direction to change the position on the surface of the alignment film 32 where the light is focused. That is, the XY stage 108 scans the surface of the alignment film 32 with the light.

The rotation of the λ/2 plate 104 and the movement of the XY stage 108 are controlled by, for example, a computer to associate the position on the surface of the alignment film 32 where the light is focused and the polarization direction of the light with each other. As a result, a desired alignment pattern can be formed on the alignment film.

The irradiation of the light beam from the light source 102, the rotation of the λ/2 plate 104, and the movement of the XY stage 108 may be performed alternately or simultaneously. That is, for example, the XY stage 108 is driven such that the alignment film 32 is moved to a predetermined position and stopped, and is rotated such that the polarization direction of the linearly polarized light transmitted through the λ/2 plate 104 is a predetermined direction. Next, the alignment film 32 is irradiated with the light beam from the light source 102 to expose a predetermined position on the surface of the alignment film 32, and the irradiation of the light is stopped. Next, the XY stage 108 is driven such that the alignment film 32 is moved to a next predetermined position (exposure position) and stopped, and is rotated such that the polarization direction of the linearly polarized light transmitted through the λ/2 plate 104 is a predetermined direction. Next, the alignment film 32 is irradiated with the light beam from the light source 102 to expose a predetermined position on the surface of the alignment film 32, and the irradiation of the light is stopped. This way, by alternately repeating the movement of the XY stage 108 and the irradiation of the light beam from the light source 102, the exposure of the alignment film 32 may be intermittently performed.

Alternatively, while driving the XY stage 108 to move the alignment film 32 in a predetermined direction and rotating the λ/2 plate 104, the surface of the alignment film 32 may be irradiated with the light beam from the light source 102 to continuously expose the surface of the alignment film 32.

Alternatively, for example, in a case where an alignment pattern including regions where orientations of alignment axes are different in a stripe shape is exposed, while irradiating a region where the orientations of the alignment axes are the same with the light beam from the light source 102 in a state where the λ/2 plate is fixed in a certain direction, the XY stage 108 is driven to move the alignment film 32 in a predetermined direction and to expose the region. Next, in order to expose a region where the orientation of the alignment axis is different from that of the previous region, while rotating the λ/2 plate and irradiating the region with the light beam from the light source 102, the XY stage 108 is driven to move the alignment film 32 in a predetermined direction and to expose the region. By repeating the exposure, the alignment pattern including regions where orientations of alignment axes are different in a stripe shape may be exposed.

The intensity, exposure time, and the like of the light to be irradiated may be appropriately set depending on the material for forming the alignment film and the like.

The exposure amount per unit area can be adjusted by adjusting the intensity of the light to be irradiated and a scanning speed. From the viewpoint of performing sufficient exposure to apply aligning properties to the alignment film 32, the exposure amount is preferably 100 mJ/m$^2$ or more and more preferably 150 mJ/m$^2$. In addition, from the viewpoint of preventing a decrease in aligning properties caused by excessive irradiation, the exposure amount is preferably 5 J/m$^2$ or less and more preferably 3 J/m$^2$ or less.

In addition, the spot diameter of the focused light beam on the alignment film may be a size where a desired alignment pattern can be applied to the alignment film.

Here, the method of exposing an alignment film using a direct drawing method is advantageous in that an alignment pattern having any shape such as an elliptical pattern as shown in FIG. 10 can be formed. However, in a case where an alignment film is exposed using a direct drawing method, the XY stage needs to be moved with a finer position accuracy than the single period of the liquid crystal alignment pattern, but the position accuracy is insufficient in the direct drawing method in the related art. Therefore, in an optically-anisotropic layer that is formed using the alignment film exposed with the direct drawing method, a variation in the single periods of the liquid crystal alignment pattern is large. That is, in a case where the optically-anisotropic layer is observed with an optical microscope, a variation in the widths of the bright lines and the widths of the dark lines is large. Therefore, in a case where the optically-anisotropic layer that is formed using the alignment film exposed with the direct drawing method in the related art is used for a HMD such as VR glasses, a ghost by the high-order diffracted light occurs.

Figure 13:
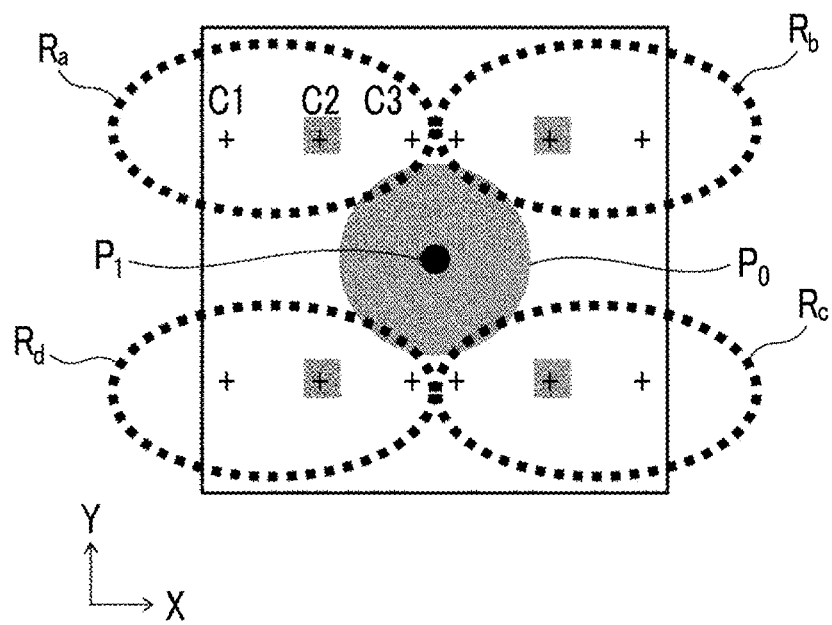
FIG. 13 is a diagram showing an exposure method.

On the other hand, in the present invention, in the method of exposing an alignment film using a direct drawing method, a marker for alignment shown in FIG. 13 is formed on the support 30 or the alignment film 32, and in a case where the XY stage 108 is driven to align the exposure position of the alignment film 32 with a predetermined position, this marker is detected with a camera, and coordinates of the XY stage 108 are modified for the alignment based on the position information of the marker. As a result, high-accuracy alignment can be performed, and an alignment pattern with which an optically-anisotropic layer where a variation in the single periods of the liquid crystal alignment pattern is small can be formed can be given to an alignment film. That is, an alignment pattern can be given to an alignment film, the alignment pattern being a pattern for forming an optically-anisotropic layer in which, in a case where a main surface of the optically-anisotropic layer is observed with an optical microscope, both of a ratio between a maximum value and a minimum value among widths of 30 continuous bright lines and a ratio between a maximum value and a minimum value among widths of 30 continuous dark lines in the region are 1.2 or less.

FIG. 13 is a view showing an alignment film in a view from a direction perpendicular to the main surface, in which a region $P_0$ represents the entire region to be exposed, $P_1$ represents the focusing position (spot), and cross-shaped markers (C1 to C3) are provided in four regions ($R_a$ to $R_d$) around the exposure region $P_0$.

Hereinafter, an example of an exposure method for forming an alignment pattern where bright lines and dark lines are formed in a concentric shape using the direct drawing method according to the embodiment of the present invention will be described.

1. The axis of the λ/2 plate is adjusted such that light with which a photosensitive material (photo-alignment film) is to be irradiated is linearly polarized light in the direction of 0°.
2. While moving a movable stage in the x direction and the y direction for scanning simultaneously in a state where the light is irradiated, the photosensitive material is exposed in a circumferential shape having a radius r [mm].
3. Once the light irradiation is stopped, the movable stage is moved in the y direction by Δr. In this case, the alignment marker in the photosensitive material or the support that supports the photosensitive material is detected with the camera, and the amount of movement Δr is detected. In a case where the detected Δr does not satisfy required accuracy, the movable stage is moved in the y direction again, and the alignment is repeated until the required accuracy is satisfied.
4. The axis of the λ/2 plate is adjusted such that light with which the photosensitive material is to be irradiated is linearly polarized light rotated by the direction of 40°.
5. The light irradiation starts again, and while moving the movable stage in the x direction and the y direction for scanning simultaneously, the photosensitive material is exposed in a circumferential shape having a radius r−Δr [mm].

By repeating 3 to 5, the exposed alignment film having the concentric alignment pattern is manufactured.

The amount of change $\Delta\theta$ of the polarized angle of the linearly polarized light is preferably 45° or less. In the liquid crystal alignment pattern where the optical axis changes while continuously rotating in the one direction by finely drawing the pattern, the change speed of the optical axis can be made to be fixed irrespective of characteristics of the liquid crystal material.

The amount of movement $\Delta r$ of the movable stage is preferably ¼ or less with respect to the single period of the liquid crystal alignment pattern. In the liquid crystal alignment pattern where the optical axis changes while continuously rotating in the one direction by finely drawing the pattern, the change speed of the optical axis can be made to be fixed irrespective of characteristics of the liquid crystal material.

The required accuracy of the amount of movement $\Delta r$ of the movable stage is preferably ½ or less, more preferably ¼ or less, and still more preferably 1/10 or less with respect to the amount of movement $\Delta r$ of the movable stage.

In the present invention, as described above, the marker is detected with the camera as described above, and the coordinates of the XY stage 108 are modified for alignment based on the position information of the marker.

In order to determine the position coordinates and the rotation angle of the alignment film 32 fixed to the XY stage 108, it is preferable to use a plurality of cameras during the alignment. By using the plurality of cameras, while maintaining an imaging magnification required for fine alignment, position coordinates of two points that are sufficiently spaced from each other on the alignment film 32 can be determined, and the sufficient accuracy for the position coordinates and the rotation angle can be ensured for the alignment.

As the marker, a single marker or a plurality of markers may be provided as long as the positions of two points that are sufficiently spaced from each other can be verified with a plurality of cameras. Here, the distance between the two points that are sufficiently spaced from each other is preferably 10 mm or more, more preferably 30 mm or more, still more preferably 50 mm or more, and still more preferably 80 mm or more.

In addition, it is also preferable that positions more than two points are simultaneously verified by a plurality of cameras.

In the example shown in FIG. 13, the markers are provided in the four regions ($R_a$ to $R_d$). However, a marker may be provided in at least one region, and it is preferable that markers are provided in three or more regions. By providing markers in three or more regions, the alignment can be performed using two markers provided at positions between which the exposure region $P_0$ is interposed in the X direction, and the alignment can be performed using two markers provided at positions between which the exposure region $P_0$ is interposed in the Y direction. Therefore, the coordinates of the XY stage can be more accurately aligned.

The shape of the marker can be any shape such as a cross shape, a dot shape, a linear shape, a circular shape, or a quadrangular shape. In addition, the marker may be an aggregate or a lattice.

It is preferable that the line width of the marker is less than the single period of the liquid crystal alignment pattern. By reducing the line width of the marker, the XY stage can be accurately aligned.

In addition, the size of the marker is preferably 30 μm or more and more preferably 100 μm or more. As a result, the detection of the marker by the camera is simple.

[Image Display Apparatus and Head Mounted Display]

An image display apparatus according to the embodiment of the present invention includes the above-described liquid crystal diffraction element according to the embodiment of the present invention and a display panel.

The image display apparatus including the liquid crystal diffraction element according to the embodiment of the present invention can be suitably used as an image display apparatus of a head mounted display such as augmented reality (AR) glasses, VR glasses, or mixed reality (MR) glasses.

Figure 14:
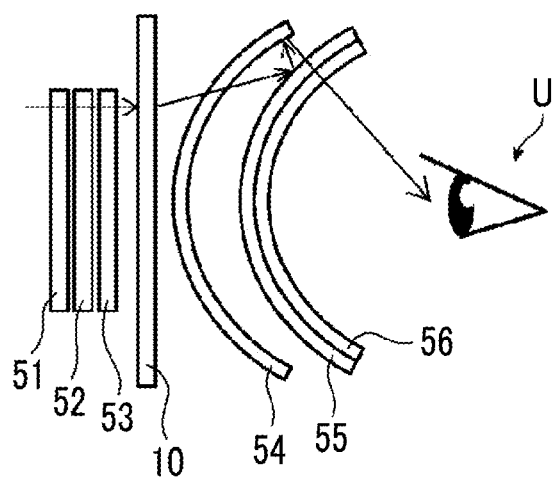
FIG. 14 is a diagram conceptually showing an example of an image display apparatus including a liquid crystal diffraction element according to the present invention.

FIG. 14 conceptually shows an example of an image display apparatus including the liquid crystal diffraction element according to the embodiment of the present invention.

An image display apparatus 50 shown in FIG. 14 includes a display panel 51, a linear polarizer 52, a retardation layer 53, the liquid crystal diffraction element 10, a half mirror 54, a reflective circular polarizer 55, and a circularly polarizing plate 56 in this order. The image display apparatus 50 is suitably used for an HMD that displays AR, VR, MR, or the like.

The display panel 51 is a well-known image display panel (display). Examples of the image display panel include a liquid crystal display panel, an organic electroluminescent display device, a light emitting diode (LED) display device, a micro LED display device, a scanning type display device in which a laser light source and a micro electro mechanical systems (MEMS) mirror are combined. In the following description, the organic electroluminescence display device will also be referred to as "OLED". OLED is an abbreviation for "Organic Light Emitting Diode".

The linear polarizer 52 converts the light emitted from the display panel 51 into linearly polarized light. The linear polarizer 52 is a known linearly polarizing plate. In a case where the display panel 51 includes a linear polarizer on the emission side as in the liquid crystal display panel, the linear polarizer in the liquid crystal display panel is regarded as the linear polarizer 52.

The retardation layer 53 converts the linearly polarized light converted by the linear polarizer 52 into circularly polarized light. The retardation layer 53 is a well-known retardation layer. The retardation layer converts linearly polarized light into circularly polarized light or converts circularly polarized light into linearly polarized light, and thus is basically a ¼ wave plate.

The liquid crystal diffraction element 10 is the above-described liquid crystal diffraction element, and diffracts the circularly polarized light in a polarization state transmitted through the reflective circular polarizer 55 to be diffused.

The half mirror 54 is a semi-transmissive and semi-reflective half mirror that reflects a part of incident light and allows transmission of the remaining light. In addition, as shown in FIG. 14, the half mirror 54 has a curved surface portion that is convexly curved on the display panel 51 side.

In the incident light, the reflective circular polarizer 55 reflects the circularly polarized light in a state converted by the retardation layer 53, and transmits the other circularly polarized light. That is, the circularly polarized light transmitted through the half mirror 54 without being reflected is reflected. In addition, as shown in FIG. 14, the reflective circular polarizer 55 has a curved surface portion that is convexly curved on the display panel 51 side. The reflective circular polarizer 55 may have a flat plate shape that does not have a curved surface portion.

The circularly polarizing plate 56 is a circularly polarizing plate that transmits the circularly polarized light diffracted by the liquid crystal diffraction element 10 and cuts circularly polarized light in a polarization state opposite to that of the circularly polarized light. The circularly polarizing plate 56 may consist of a retardation layer and a linear polarizer or may have a typical cholesteric liquid crystal layer. By providing the circularly polarizing plate 56, unnecessary light (zero-order light) that is not diffracted by the liquid crystal diffraction element 10 can be cut. The image display apparatus 50 may have a configuration in which the circularly polarizing plate 56 is not provided.

An action of the image display apparatus 50 will be described.

The display panel 51 emits light that forms an image. In this case, light is emitted from each of points (each of pixels) of the display panel 51 toward various directions, and the amount of light in the direction perpendicular to the display panel 51 is the largest. In the light emitted by the display panel 51, a linearly polarized light component transmits through the linear polarizer 52. The linearly polarized light transmitted through the linear polarizer 52 is incident into the retardation layer 53 and is converted into circularly polarized light. For example, a case where the linearly polarized light is converted into right circularly polarized light will be described.

The circularly polarized light converted by the retardation layer 53 is incident into the liquid crystal diffraction element 10. The liquid crystal diffraction element 10 diffracts the light emitted in a direction perpendicular to the display panel 51 toward the outer side in the plane direction. In this case, the light emitted from an end side of the display panel 51 is diffracted at a larger angle. As a result, as indicated by an arrow in FIG. 14, light is reflected between the half mirror 54 and the reflective circular polarizer 55, and subsequently the light incident into the eyes of an observer U as appropriate image light can be emitted in a direction perpendicular to the display panel 51. In addition, the intensity of light that reaches the eyes of the observer as zero-order light can be weakened.

Next, in the liquid crystal diffraction element 10 according to the embodiment of the present invention, in a case where a main surface of the optically-anisotropic layer in a region having a period shorter than or equal to the average period $\Lambda$a is observed with an optical microscope, both of a ratio between a maximum value and a minimum value among widths of 30 continuous bright lines and a ratio between a maximum value and a minimum value among widths of 30 continuous dark lines in the region are 1.2 or less. Therefore, the occurrence of the high-order diffracted light can be suppressed, and thus occurrence of a ghost caused by the high-order diffracted light in the HMD can be prevented.

The circularly polarized light diffracted by the liquid crystal diffraction element 10 is incident into the half mirror 54, a part of the light transmits through the half mirror 54, and the remaining part of the light is reflected from the half mirror 54. The right circularly polarized light transmitted through the half mirror 54 is incident into the reflective circular polarizer 55. Since the reflective circular polarizer 55 reflects the circularly polarized light in a state converted by the retardation layer 53, that is, reflects the right circularly polarized light, the incident right circularly polarized light is reflected to be incident into the half mirror 54 again. In this case, since the reflective circular polarizer 55 has a shape that is convexly curved on the half mirror 54 side, the reflected right circularly polarized light is reflected to be diffused.

In the right circularly polarized light reflected from the reflective circular polarizer 55 and incident into the half mirror 54, a part is reflected from the half mirror 54, and the remaining part transmits through the half mirror 54. Here, the circularly polarized light reflected from the half mirror 54 is converted into circularly polarized light having an opposite turning direction, in this example, left circularly polarized light. In this case, since the half mirror 54 has a shape that is concavely curved on the reflective circular polarizer 55 side, the reflected left circularly polarized light is reflected to be collected.

The left circularly polarized light reflected from the half mirror 54 is incident into the reflective circular polarizer 55 again. The circularly polarized light (right circularly polarized light) reflected from the half mirror 54 is converted into circularly polarized light (left circularly polarized light) having an opposite turning direction, and thus transmits through the reflective circular polarizer 55 without being reflected therefrom.

This way, in a case where the light is reciprocated between the half mirror 54 and the reflective circular polarizer 55 to increase the optical path length, an image displayed by the display panel 51 is observed by the user U such that the image is located farther from the position of the display panel 51. As a result, the image display apparatus 50 can display the image displayed by the display panel 51 as an image of AR, VR, or MR.

In the example shown in FIG. 14, the half mirror 54 and the reflective circular polarizer 55 are disposed in this order from the display panel 51 side. However, the present invention is not limited to this example. The reflective circular polarizer 55 and the half mirror 54 may be disposed in this order from the display panel 51 side.

In addition, in the example shown in FIG. 14, the reflective circular polarizer 55 is provided, and the retardation layer 53 is provided between the linear polarizer 52 and the half mirror 54. However, the present invention is not limited to this example. For example, a reflective linear polarizer may be provided instead of the reflective circular polarizer 55. In this case, it is preferable that the retardation layer is disposed between the half mirror 54 and the reflective linear polarizer.

In addition, as another example, a configuration where the liquid crystal diffraction element 10 according to the embodiment of the present invention is bonded to the display panel 51 through a pressure sensitive adhesive may be adopted. Further, the retardation layer, the linear polarizer, and the retardation layer may be disposed on a surface of the liquid crystal diffraction element 10 facing the display panel 51. Here, the retardation layer converts linearly polarized light into circularly polarized light or converts circularly polarized light into linearly polarized light, and thus is basically a ¼ wave plate.

Hereinabove, the liquid crystal diffraction element, the image display apparatus, and the head mounted display according to the embodiment of the present invention have been described in detail. However, the present invention is not limited to the above-described examples, and various improvements and modifications can be made within a range not departing from the scope of the present invention.

EXAMPLES

Hereinafter, the characteristics of the present invention will be described in detail using examples. Materials, chemicals, used amounts, material amounts, ratios, treatment details, treatment procedures, and the like shown in the following examples can be appropriately changed within a range not departing from the scope of the present invention. Accordingly, the scope of the present invention is not limited to the following specific examples.

Comparative Example 1

<Manufacturing of Liquid Crystal Diffraction Element>
(Support)
A flat plate-shaped glass substrate was prepared as the support.
(Formation of Alignment Film)
The following coating liquid for forming an alignment film was applied to the support by spin coating. The support on which the coating film of the coating liquid for forming an alignment film was formed was dried using a hot plate at 60° C. for 60 seconds. As a result, an alignment film was formed.
Coating Liquid for Forming Alignment Film

| Material A for photo-alignment | 1.00 part by mass |
| Water | 16.00 parts by mass |
| Butoxyethanol | 42.00 parts by mass |
| Propylene glycol monomethyl ether | 42.00 parts by mass |

—Material A for Photo-Alignment—

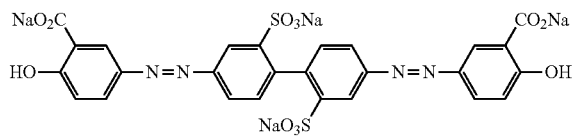

(Exposure of Alignment Film)
Using a laser light source of a wavelength of 355 nm, a λ/2 plate, a lens, and an XY stage (LD-242-MSC, manufactured by Chuo Precision Industrial Co., Ltd.), an exposure device for performing a direct drawing method was manufactured as shown in FIG. 12.

The alignment film was exposed using the exposure device to form an alignment film P-1 having a radial (concentric) alignment pattern shown in FIG. 1.

The support on which the alignment film was formed was placed on the XY stage, and the lens position was adjusted such that the focusing position was the surface of the alignment film. As the light source, a light source that emitted laser light having a wavelength (355 nm) was used.

The single period of the alignment pattern gradually decreased from the center toward the outer direction.

The single period on the outermost side, that is, the minimum value of the single period was 1.2 μm.

By alternately repeating a step of exposing a circumferential region having a radius r and a step of changing the radius by Δr and adjusting the orientation of the λ/2 plate correspondingly, a concentric alignment pattern was formed.

The amount of movement Δr of the XY stage was ¼ with respect to the single period of the liquid crystal alignment pattern. That is, in a region where the minimum value of the single period was 1.2 μm, the amount of movement Δr was set to 0.3 μm.

In addition, the maximum value of the radius r was set to 25 mm, and the exposure was performed while gradually reducing the radius r.
(Formation of Optically-Anisotropic Layer)
As the liquid crystal composition for forming the optically-anisotropic layer, the following composition A-1 was prepared.
Composition A-1

| Liquid crystal compound L-1 | 100.00 parts by mass |
| Polymerization initiator (Irgacure OXE01, manufactured by BASF SE) | 1.00 part by mass |
| Leveling agent T-1 | 0.08 parts by mass |
| Methyl ethyl ketone | 1050.00 parts by mass |

Liquid Crystal Compound L-1

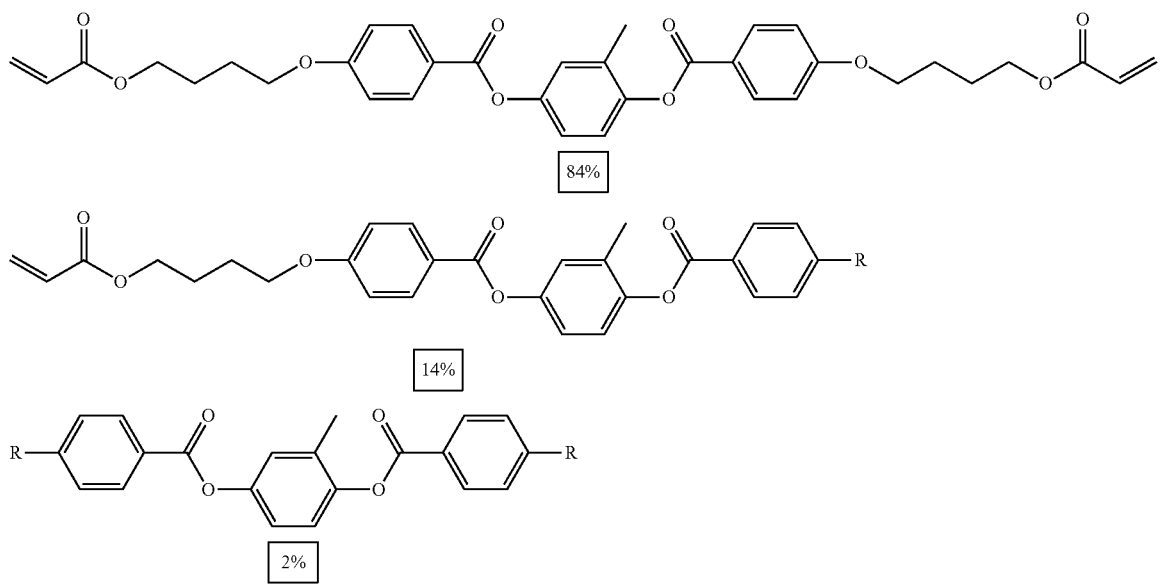

R: 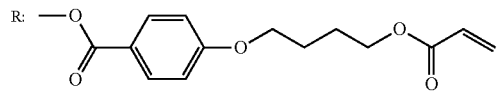

Leveling Agent T-1

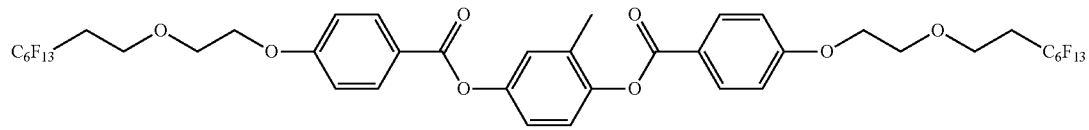

The optically-anisotropic layer was formed by applying multiple layers of the composition A-1 to the alignment film P-1. The application of the multiple layers refers to repetition of the following processes including: preparing a first liquid crystal immobilized layer by applying the composition A-1 for forming the first layer to the alignment film, heating the composition A-1, and irradiating the composition A-1 with ultraviolet light for curing; and manufacturing a second or subsequent liquid crystal immobilized layer by applying the composition A-1 for forming the second or subsequent layer to the formed liquid crystal immobilized layer, heating the composition A-1, and irradiating the composition A-1 with ultraviolet light for curing as described above. Even in a case where the liquid crystal layer was formed by the application of the multiple layers such that the total thickness of the optically-anisotropic layer was large, the alignment direction of the alignment film was reflected from a lower surface of the optically-anisotropic layer to an upper surface thereof.

Regarding the first liquid crystal layer, the following composition A-1 was applied to the alignment film P-1 to form a coating film, the coating film was heated to 80° C. using a hot plate, the coating film was irradiated with ultraviolet light having a wavelength of 365 nm at an irradiation dose of 300 mJ/cm$^2$ using a high-pressure mercury lamp in a nitrogen atmosphere. As a result, the alignment of the liquid crystal compound was immobilized.

Regarding the second or subsequent liquid crystal immobilized layer, the composition was applied to the first liquid crystal layer, and the applied composition was heated and irradiated with ultraviolet light for curing under the same conditions as described above. As a result, a liquid crystal immobilized layer was manufactured. This way, by repeating the application multiple times until the total thickness reached a desired film thickness, an optically-anisotropic layer was formed, and a liquid crystal diffraction element was manufactured. The thickness of the optically-anisotropic layer was 1.8 μm.

It was verified using a polarization microscope that the optically-anisotropic layer according to the example had a radial periodically aligned surface as shown in FIG. 1. In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion (outermost circumferential portion) at a distance of 25 mm from the center was 1.2 μm. This way, the single period decreased toward the outer direction. In addition, the twisted angle of the optically-anisotropic layer in the thickness direction was 0°. Hereinafter, unless specified otherwise, "$\Delta n_{550} \times d$" and the like were measured as described above.

In the manufactured optically-anisotropic layer, in a case where the average period Λa of 50 periods in one direction from a period having a longest length of the single period was measured using the above-described method, the average period Λa was 16 μm.

In addition, in a case where ratios between maximum values and minimum values among the widths of 30 continuous bright lines and the widths of 30 continuous dark lines were measured using the above-described method, the ratio of the widths of the bright lines was 1.4, and the ratio of the widths of the dark lines was 1.4.

A cellulose acetate film described in Examples (paragraph "0151") of WO19/111880A and a polyethylene film (trade name: protect film TORETEC #30-7832C, manufactured by Toray Advanced Film Co., Ltd.) were laminated to obtain a cellulose acetate film with a protect film. In addition, separately of the cellulose acetate film, a solution of a pressure sensitive adhesive composition according to Example 1 of JP2022-75678A was applied to a single surface of a polyethylene terephthalate film (separator film, trade name: MRF38, manufactured by Mitsubishi Chemical Group Corporation) treated with a silicone-based release agent, and was dried at 155° C. for 1 minute to form an adhesive layer on the surface of the separator film. By bonding the adhesive layer of the separator film with the adhesive layer and the cellulose acetate film of the cellulose acetate film with the protect film to each other, a film 1 with the adhesive layer where the protect film, the cellulose acetate film, the adhesive layer, and the separator film were laminated in this order was obtained.

The cellulose acetate film described in Examples (paragraph "0151") of WO19/111880A and the adhesive layer of the manufactured separator film with the adhesive layer were bonded to each other to form a film 2 with the adhesive layer where the separator film, the adhesive layer, and the cellulose acetate film were laminated in this order.

The adhesive layer of the film 1 with the adhesive layer from which the separator film was removed was bonded to the surface of the liquid crystal diffraction element formed on the glass substrate, and the liquid crystal diffraction element and the interface of the alignment film were peeled off from each other to expose the surface of the liquid crystal diffraction element on the alignment film side. Further, the surface of the liquid crystal diffraction element on the alignment film side and the adhesive layer of the film 2 with the adhesive layer from which the separator film was removed were bonded to each other. This way, a liquid crystal diffraction element for a step of manufacturing an optical element described below was obtained. After removing the protect film prior to the step of manufacturing an optical element, the liquid crystal diffraction element was used.

Example 1

A liquid crystal diffraction element was manufactured using the same method as that of Comparative Example 1, except for a configuration in which the markers shown in FIG. 13 were given to the support, the markers were detected with two cameras during the movement of the XY stage in the exposure step of the alignment film, and coordinates of the XY stage were modified for the alignment based on the position information of the markers.

The amount of movement Δr of the XY stage in the outermost circumferential portion was ¼ with respect to the single period of the liquid crystal alignment pattern. In addition, the required accuracy of the amount of movement Δr of the XY stage in the outermost circumferential portion was ¼ or less with respect to the amount of movement Δr of the XY stage.

The markers were provided in four regions on the plus side and the minus side in the X direction and the Y direction based on the exposure region.

The shape of the marker was a cross shape, the size (line length) was 1 mm, and the line width was 10 μm.

It was verified using a polarization microscope that the manufactured optically-anisotropic layer according to the example had a periodically aligned surface where the arrangement axis is radial as shown in FIG. 1. In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion (outermost circumferential portion) at a distance of 25 mm from the center was 1.2 μm. This way, the single period decreased toward the outer direction. In addition, the twisted angle of the optically-anisotropic layer in the thickness direction was 0°. A thickness of the optically-anisotropic layer A was 1.8 μm.

In the manufactured optically-anisotropic layer, in a case where the average period Λa of 50 periods in one direction from a period having a longest length of the single period was measured using the above-described method, the average period Λa was 16 μm.

In addition, in a case where ratios between maximum values and minimum values among the widths of 30 continuous bright lines and the widths of 30 continuous dark lines were measured using the above-described method, the ratio of the widths of the bright lines was 1.1, and the ratio of the widths of the dark lines was 1.1.

Example 2

A liquid crystal diffraction element was manufactured using the same method as that of Example 1, except that an optically-anisotropic layer where the dark portion had one inflection point in a cross-sectional SEM image taken in the thickness direction along the one direction was formed as follows.

(Formation of Optically-Anisotropic Layer)

As a liquid crystal composition for forming a first region of the optically-anisotropic layer, the following composition B-1 was prepared.

Composition B-1

| | |
|---|---|
| Liquid crystal compound L-2 | 100.00 parts by mass |
| Chiral agent C-1 | 0.32 parts by mass |
| Polymerization initiator (Irgacure OXE01, manufactured by BASF SE) | 1.00 part by mass |
| Leveling agent T-1 | 0.08 parts by mass |
| Methyl ethyl ketone | 1050.00 parts by mass |

Liquid Crystal Compound L-2

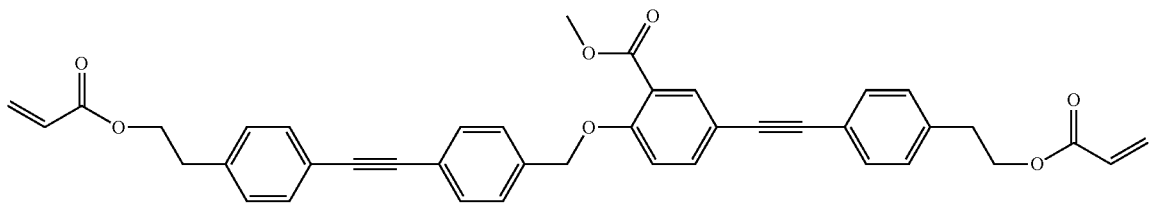 [SMILES: C=CC(=O)OCCc1ccc(C#Cc2ccc(COc3ccc(C#Cc4ccc(CCOC(=O)C=C)cc4)cc3C(=O)OC)cc2)cc1]

Chiral Agent C-1

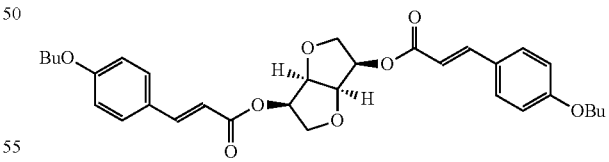

Leveling Agent T-1

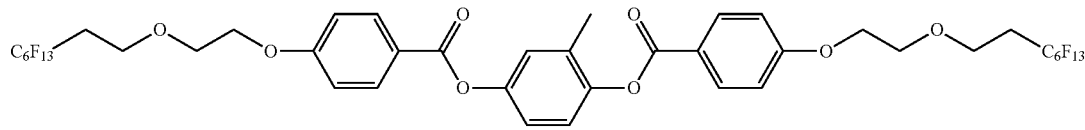

A first region of the optically-anisotropic layer was formed using the same method as that of Example 1, except that the film thickness was adjusted using the composition B-1.

It was verified using a polarization microscope that the first region of the optically-anisotropic layer according to the example had a radial periodically aligned surface as shown in FIG. 1. In the liquid crystal alignment pattern of the optically-anisotropic layer, regarding the single period over which the optical axis of the liquid crystal compound rotated by 180°, the single period of a portion at a distance of about 3 mm from the center was 10 µm, and the single period of a portion (outermost circumferential portion) at a distance of 25 mm from the center was 1.2 µm. This way, the single period decreased toward the outer direction. In addition, the twisted angle of the first region in the thickness direction was left-twisted and 70° (−70°).

As a liquid crystal composition for forming a second region of the optically-anisotropic layer, the following composition B-2 was prepared.

Composition B-2

| | |
|---|---|
| Liquid crystal compound L-2 | 100.00 parts by mass |
| Chiral agent C-2 | 0.18 parts by mass |
| Polymerization initiator (Irgacure OXE01, manufactured by BASF SE) | 1.00 part by mass |
| Leveling agent T-1 | 0.08 parts by mass |
| Methyl ethyl ketone | 1050.00 parts by mass |

Chiral Agent C-2

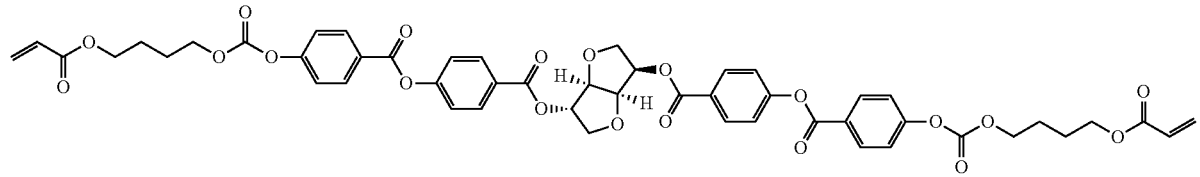 [SMILES: C=CC(=O)OCCCCOC(=O)Oc1ccc(C(=O)Oc2ccc(C(=O)O[C@H]3CO[C@H]4[C@@H]3OC[C@H]4OC(=O)c3ccc(OC(=O)c4ccc(OC(=O)OCCCCOC(=O)C=C)cc4)cc3)cc2)cc1]

A second region of the optically-anisotropic layer was formed using the same method as that of the first region of the optically-anisotropic layer, except that the film thickness was adjusted using the composition B-2.

It was verified using a polarization microscope that the second region of the optically-anisotropic layer according to the example had a radial periodically aligned surface as shown in FIG. 1. In addition, the liquid crystal alignment pattern of the second region was the liquid crystal alignment pattern where the period decreased toward the outer direction as in the first region. In addition, the twisted angle of the second region in the thickness direction was right-twisted and 70°. A thickness of the optically-anisotropic layer A was 2.2 µm.

In a case where a cross-section of the manufactured optically-anisotropic layer was observed with an SEM, the dark portion had one inflection point.

In the manufactured optically-anisotropic layer, in a case where the average period Λa of 50 periods in one direction from a period having a longest length of the single period was measured using the above-described method, the average period Λa was 16 µm.

In addition, in a case where ratios between maximum values and minimum values among the widths of 30 continuous bright lines and the widths of 30 continuous dark lines were measured using the above-described method, the ratio of the widths of the bright lines was 1.1, and the ratio of the widths of the dark lines was 1.1.

Example 3

A liquid crystal diffraction element was manufactured using the same method as that of Example 1, except that an optically-anisotropic layer where the dark portion had two inflection points in a cross-sectional SEM image taken in the thickness direction along the one direction was formed as follows.

(Formation of Optically-Anisotropic Layer)

As a liquid crystal composition for forming a first region of the optically-anisotropic layer, the following composition D-1 was prepared.

Composition D-1

| | |
|---|---|
| Liquid crystal compound L-2 | 100.00 parts by mass |
| Chiral agent C-3 | 0.23 parts by mass |
| Chiral agent C-4 | 0.82 parts by mass |
| Polymerization initiator (Irgacure OXE01, manufactured by BASF SE) | 1.00 part by mass |
| Leveling agent T-1 | 0.08 parts by mass |
| Methyl ethyl ketone | 1050.00 parts by mass |

Chiral Agent C-3

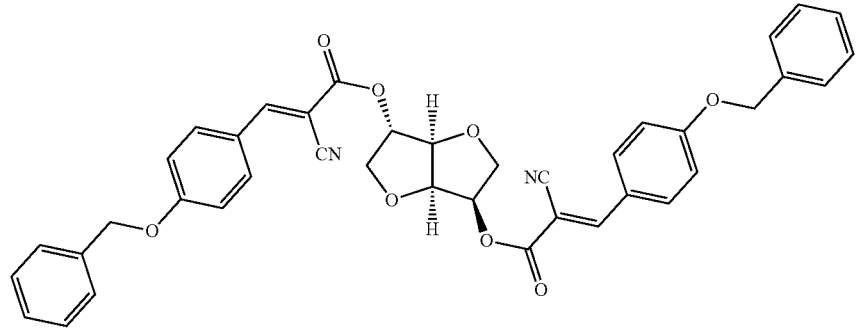 [SMILES: N#C/C(=C\c1ccc(OCc2ccccc2)cc1)C(=O)O[C@H]1CO[C@H]2[C@@H]1OC[C@H]2OC(=O)/C(C#N)=C/c1ccc(OCc2ccccc2)cc1]

Chiral Agent C-4

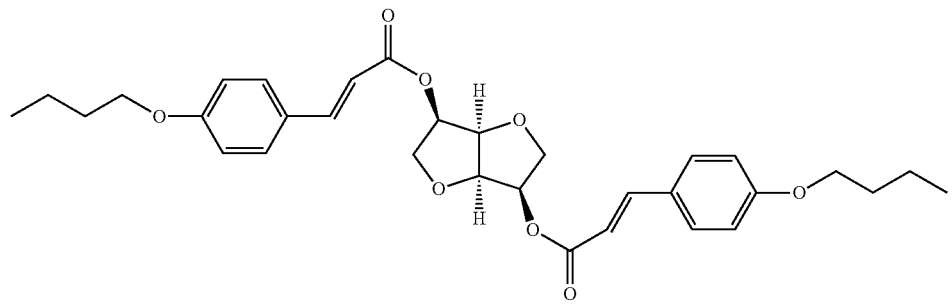 [SMILES: CCCCOc1ccc(/C=C/C(=O)O[C@@H]2CO[C@H]3[C@@H]2OC[C@H]3OC(=O)/C=C/c2ccc(OCCCC)cc2)cc1]

As a liquid crystal composition for forming a second region of the optically-anisotropic layer, a composition D-2 was prepared using the same method as that of the composition D-1, except that the amount of the chiral agent C-3 was changed to 0.54 parts by mass and the amount of the chiral agent C-4 was changed to 0.62 parts by mass.

As the liquid crystal composition for forming a third region of the optically-anisotropic layer, a composition D-3 was prepared using the same method as that of the composition D-1, except that the amount of the chiral agent C-3 was changed to 0.48 parts by mass and the chiral agent C-4 was not added.

First to third regions of the optically-anisotropic layer were formed using the same method as that of Example 1, except that the film thicknesses were adjusted using the compositions D-1, D-2, and D-3.

It was verified using a polarization microscope that the first region of the optically-anisotropic layer according to the example had a radial periodically aligned surface as shown in FIG. 1. In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion (outermost circumferential portion) at a distance of 25 mm from the center was 1.2 μm. This way, the single period decreased toward the outer direction. In addition, the twisted angle of the first region in the thickness direction was left-twisted and 80° (−80°).

It was verified using a polarization microscope that the second region of the optically-anisotropic layer according to the example had a radial periodically aligned surface as shown in FIG. 1. In addition, the liquid crystal alignment pattern of the second region was the liquid crystal alignment pattern where the period decreased toward the outer direction as in the first region. In addition, the twisted angle in the second region in the thickness direction was 0°.

It was verified using a polarization microscope that the third region of the optically-anisotropic layer according to the example had a radial periodically aligned surface as shown in FIG. 1. In addition, the liquid crystal alignment pattern of the third region was the liquid crystal alignment pattern where the period decreased toward the outer direction as in the first region. In addition, the twisted angle of the third region in the thickness direction was right-twisted and 80° (twisted angle: 80°). A thickness of the optically-anisotropic layer A was 2.8 μm.

This way, the optically-anisotropic layer was formed.

In a case where a cross-section of the manufactured optically-anisotropic layer was observed with an SEM, the dark portion had two inflection points.

In the manufactured optically-anisotropic layer, in a case where the average period Λa of 50 periods in one direction from a period having a longest length of the single period was measured using the above-described method, the average period Λa was 16 μm.

In addition, in a case where ratios between maximum values and minimum values among the widths of 30 continuous bright lines and the widths of 30 continuous dark lines were measured using the above-described method, the ratio of the widths of the bright lines was 1.1, and the ratio of the widths of the dark lines was 1.1.

Example 4

An optically-anisotropic layer was formed and a liquid crystal diffraction element was manufactured using the same method as that of Example 3, except that the liquid crystal compound in the compositions D-1, D-2, and D-3 was changed to L-1, and the thickness of the optically-anisotropic layer was 4.7 μm.

Example 5

A liquid crystal diffraction element was manufactured using the same method as that of Example 3, except that in the exposure step of the alignment film the XY stage was changed to ANT95XY-050 (manufactured by Aerotech US.), the markers were detected with three cameras during the movement of the XY stage, and coordinates of the XY stage were modified for the alignment based on the position information of the markers, the amount of movement Δr of the XY stage in the outermost circumferential portion was ⅛ with respect to the single period of the liquid crystal alignment pattern, and the required accuracy of the amount of movement Δr of the XY stage in the outermost circumferential portion was ¼ or less with respect to the amount of movement Δr of the XY stage.

Example 6

A liquid crystal diffraction element was manufactured using the same method as that of Example 3, except that the amount of movement Δr of the XY stage in the outermost circumferential portion was ¼ with respect to the single period of the liquid crystal alignment pattern, and the required accuracy of the amount of movement Δr of the XY stage in the outermost circumferential portion was ½ or less with respect to the amount of movement Δr of the XY stage.

(Manufacturing of Retardation Plate)

A film including a cellulose acylate film, an alignment film, and an optically-anisotropic layer C was obtained using the same method as a positive A plate described in paragraphs "0102" to "0126" of JP2019-215416A. The optically-anisotropic layer C was the positive A plate (retardation plate), and the thickness of the positive A plate was controlled such that Re(550) was 138 nm.

(Manufacturing of Laminated Optical Films A and B)

The prepared retardation plate was bonded to a linearly polarizing plate (polyvinyl alcohol layer type) through a pressure sensitive adhesive to manufacture a laminated optical film A as a circularly polarizing plate. The retardation plate and the linearly polarizing plate were disposed such that a relative angle between a slow axis of the retardation plate and an absorption axis of the linearly polarizing plate was 45°.

The manufactured retardation plate was bonded to both surfaces of a linearly polarizing plate (polyvinyl alcohol layer type) through a pressure sensitive adhesive to manufacture a laminated optical film B where the retardation plate, the linearly polarizing plate, and the retardation plate were laminated in this order. The retardation plate and the linearly polarizing plate were disposed such that a relative angle between a slow axis of the retardation plate and an absorption axis of the linearly polarizing plate was 45°.

<Manufacturing of Optical Element>

The manufactured laminated optical film A was bonded to one surface of the liquid crystal diffraction element manufactured in each of Examples 1 to 6 and Comparative Example 1, and the laminated optical film B was bonded to the other surface of the liquid crystal diffraction element to manufacture an optical laminate for mounting including the liquid crystal diffraction element. The optical laminate was manufactured by laminating the linearly polarizing plate, the retardation plate, the liquid crystal diffraction element, the retardation plate, the linearly polarizing plate, and the retardation plate in this order.

[Evaluation]

<Evaluation of Ghost>

A lens of a virtual reality display device "Huawei VR Glass" (manufactured by Huawei Technologies Co., Ltd.) as a virtual reality display device adopting a reciprocating optical system was disassembled, and a display was taken out. After peeling the polarizer bonded to the surface of the display, the optical laminate for mounting including the liquid crystal diffraction element was bonded.

By reassembling the display to which the optical laminate for mounting including the liquid crystal diffraction element was bonded, a virtual reality display device was manufactured. In the manufactured virtual reality display device, a black-and-white checkered pattern was displayed on an image display panel, and ghost visibility was evaluated by visual inspection based on the following three grades.

A: the ghost was not visual at all

B: the ghost was slightly visible, but not noticeable

C: the ghost was clearly visible

The results are shown in Table 1.

TABLE 1

| | | Exposure Conditions | | Optically-Anisotropic Layer | | | | |
| --- | --- | --- | --- | --- | --- | --- | --- | --- |
| | Marker | Amount of Movement $\Delta r$ (with respect to Single Period) | Required Accuracy of $\Delta r$ (with respect to $\Delta r$) | Number of Inflection Points | Thickness ($\mu m$) | Minimum Value of Single Period ($\mu m$) | Ratio of Widths of Bright Lines | Ratio of Widths of Dark Lines | Evaluation Ghost |
| Comparative Example 1 | Not Provided | 1/4 | — | 0 | 1.8 | 1.2 | 1.4 | 1.4 | C |
| Example 1 | Provided | 1/4 | 1/4 | 0 | 1.8 | 1.2 | 1.1 | 1.1 | B |
| Example 2 | Provided | 1/4 | 1/4 | 1 | 2.2 | 1.2 | 1.1 | 1.1 | B |
| Example 3 | Provided | 1/4 | 1/4 | 2 | 2.8 | 1.2 | 1.1 | 1.1 | A |
| Example 4 | Provided | 1/4 | 1/4 | 2 | 4.7 | 1.2 | 1.1 | 1.1 | B |
| Example 5 | Provided | 1/8 | 1/4 | 2 | 2.8 | 1.2 | 1.05 | 1.05 | A |
| Example 6 | Provided | 1/4 | 1/2 | 2 | 2.8 | 1.2 | 1.2 | 1.2 | B |

It can be seen from Table 1, in Examples of the present invention, occurrence of a ghost can be suppressed as compared to Comparative Examples.

It can be seen from a comparison between Examples 1 to 3 that it is preferable that, in a cross-sectional SEM image of the optically-anisotropic layer taken in the thickness direction, the dark portion has an inflection point.

In addition, it can be seen from a comparison between Examples 3 and 4 that the thickness of the optically-anisotropic layer is preferably 3 μm or less.

In addition, it can be seen from a comparison between Examples 3, 5, and 6 that, by reducing the amount of movement $\Delta r$ of the XY stage or increasing the required accuracy of $\Delta r$, the ratios between the maximum values and the minimum values among the widths of the bright lines and the widths of the dark lines can be reduced, and a ghost can be more suitably reduced.

As can be seen from the above results, the effects of the present invention are obvious.

EXPLANATION OF REFERENCES

10: liquid crystal diffraction element
12, 12b to 12e: optically-anisotropic layer
30: support
32: alignment film
37a to 37c: region
40: liquid crystal compound
40A: optical axis
42: bright portion (bright line)
44: dark portion (dark line)
50: image display apparatus
51: display panel
52: linear polarizer
53: retardation layer
54: half mirror
55: reflective circular polarizer
56: circularly polarizing plate 100: exposure device
102: light source
104: λ/2 plate
106: lens
108: XY stage
Λ: single period
Λa: average period
D, $A_1$ to $A_3$: arrangement axis
R: region
$L_1$, $L_2$, $L_4$, $L_5$: light
$R_a$ to $R_d$: region
C1 to C3: marker
$P_0$: exposure region
$P_1$ to $P_3$: position
U: user

What is claimed is:

1. A liquid crystal diffraction element comprising:
at least an optically-anisotropic layer that is formed of a liquid crystal composition including a liquid crystal compound,
wherein the optically-anisotropic layer has a liquid crystal alignment pattern in which an orientation of an optical axis derived from the liquid crystal compound changes while continuously rotating in at least one in-plane direction,
in a case where a length over which the optical axis rotates by 180 degrees in the one direction is set as a single period, the single period gradually changes in the one direction, and
in a case where an average period of 50 periods in the one direction from a period having a longest length of the single period is represented by Λa and a main surface of the optically-anisotropic layer in a region having a period shorter than or equal to the average period Λa is observed with an optical microscope, both of a ratio between a maximum value and a minimum value among widths of 30 continuous bright lines and a ratio between a maximum value and a minimum value among widths of 30 continuous dark lines in the region are 1.2 or less.

2. The liquid crystal diffraction element according to claim 1,
wherein in a cross-sectional image of the optically-anisotropic layer obtained by observing a cross-section taken in a thickness direction along the one direction with a scanning electron microscope, the optically-anisotropic layer has bright portions and dark portions extending from one main surface to another main surface, and
the dark portion has one or more inflection points.

3. The liquid crystal diffraction element according to claim 1,
wherein a thickness of the optically-anisotropic layer is 3 μm or less.

4. The liquid crystal diffraction element according to claim 1,
wherein a minimum value of the single period of the optically-anisotropic layer is 1.5 μm or less.

5. The liquid crystal diffraction element according to claim 1,
wherein in the liquid crystal alignment pattern of the optically-anisotropic layer, the one direction in which the orientation of the optical axis derived from the liquid crystal compound changes while continuously rotating is provided in a radial shape from an inner side toward an outer side.

6. The liquid crystal diffraction element according to claim 1,
wherein the bright lines and the dark lines observed during the observation of the main surface of the optically-anisotropic layer with the optical microscope have an elliptical shape.

7. The liquid crystal diffraction element according to claim 2,
wherein the optically-anisotropic layer has regions in which the average tilt angle of the dark portions increases as the length of the single period of the liquid crystal alignment pattern decreases.

8. An image display apparatus comprising:
the liquid crystal diffraction element according to claim 1; and
a display panel.

9. A head mounted display comprising:
the image display apparatus according to claim 8.

10. The liquid crystal diffraction element according to claim 2,
wherein a thickness of the optically-anisotropic layer is 3 μm or less.

11. The liquid crystal diffraction element according to claim 2,
wherein a minimum value of the single period of the optically-anisotropic layer is 1.5 μm or less.

12. The liquid crystal diffraction element according to claim 2,
wherein in the liquid crystal alignment pattern of the optically-anisotropic layer, the one direction in which the orientation of the optical axis derived from the liquid crystal compound changes while continuously rotating is provided in a radial shape from an inner side toward an outer side.

13. The liquid crystal diffraction element according to claim 2,
wherein the bright lines and the dark lines observed during the observation of the main surface of the optically-anisotropic layer with the optical microscope have an elliptical shape.

14. An image display apparatus comprising:
the liquid crystal diffraction element according to claim 2; and
a display panel.

15. A head mounted display comprising:
the image display apparatus according to claim 14.

16. The liquid crystal diffraction element according to claim 3,
wherein a minimum value of the single period of the optically-anisotropic layer is 1.5 μm or less.

17. The liquid crystal diffraction element according to claim 3,
wherein in the liquid crystal alignment pattern of the optically-anisotropic layer, the one direction in which the orientation of the optical axis derived from the liquid crystal compound changes while continuously rotating is provided in a radial shape from an inner side toward an outer side.

18. The liquid crystal diffraction element according to claim 3,
wherein the bright lines and the dark lines observed during the observation of the main surface of the optically-anisotropic layer with the optical microscope have an elliptical shape.

19. An image display apparatus comprising:
the liquid crystal diffraction element according to claim 3; and
a display panel.

20. A head mounted display comprising:
the image display apparatus according to claim 19.

\* \* \* \* \*